United States Patent
Terpilowski et al.

(10) Patent No.: US 11,875,783 B2
(45) Date of Patent: Jan. 16, 2024

(54) METHOD AND SYSTEM OF AUDIO INPUT BIT-SIZE CONVERSION FOR AUDIO PROCESSING

(71) Applicant: Intel Corporation, Santa Clara, CA (US)

(72) Inventors: Marcin Terpilowski, Gdansk (PL); Tomasz Dorau, Gdansk (PL); Tobias Bocklet, Kronach (DE)

(73) Assignee: Intel Corporation, Santa Clara, CA (US)

( * ) Notice: Subject to any disclaimer, the term of this patent is extended or adjusted under 35 U.S.C. 154(b) by 712 days.

(21) Appl. No.: 16/892,080

(22) Filed: Jun. 3, 2020

(65) Prior Publication Data
US 2020/0294493 A1  Sep. 17, 2020

(51) Int. Cl.
*G10L 15/16*  (2006.01)
*G06F 3/16*   (2006.01)

(52) U.S. Cl.
CPC .............. *G10L 15/16* (2013.01); *G06F 3/162* (2013.01); *G06F 3/165* (2013.01)

(58) Field of Classification Search
CPC . G10L 15/16; G06F 3/162; G06F 3/16; G06F 3/165
See application file for complete search history.

(56) References Cited

U.S. PATENT DOCUMENTS

| | | |
|---|---|---|
| 10,083,689 B2 | 9/2018 | Bocklet et al. |
| 2011/0224991 A1* | 9/2011 | Fejzo ................... G10L 19/0017 704/500 |
| 2018/0121796 A1 | 5/2018 | Deisher et al. |
| 2019/0043477 A1 | 2/2019 | Bang et al. |
| 2019/0043488 A1* | 2/2019 | Bocklet ................... G10L 15/22 |

\* cited by examiner

*Primary Examiner* — Fan S Tsang
*Assistant Examiner* — David Siegel
(74) *Attorney, Agent, or Firm* — Essential Patents Group, LLP

(57) ABSTRACT

A method, system, and device are directed to audio input bit-size conversion for compatibility to audio processing systems with an expected input sample bit-size.

25 Claims, 20 Drawing Sheets

400

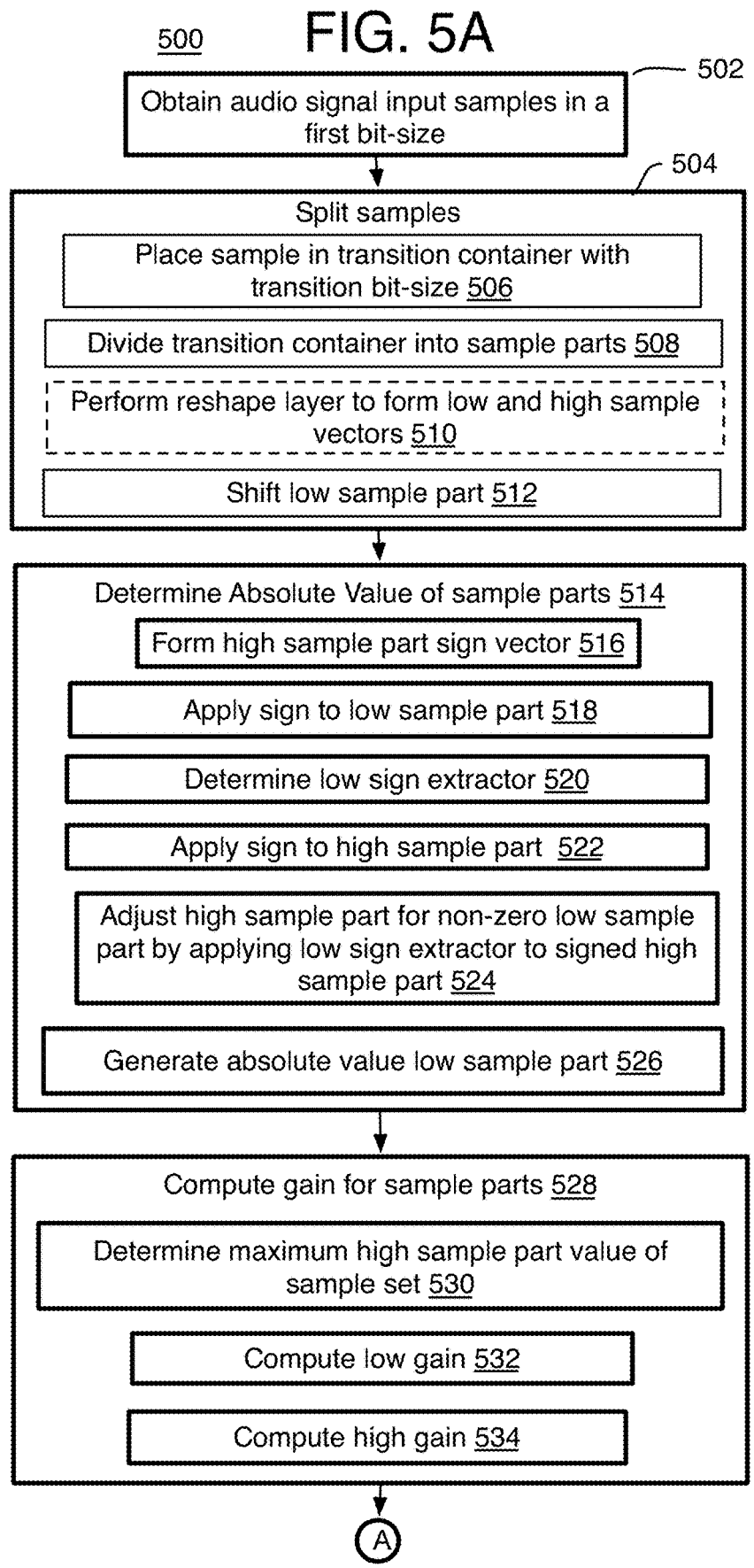

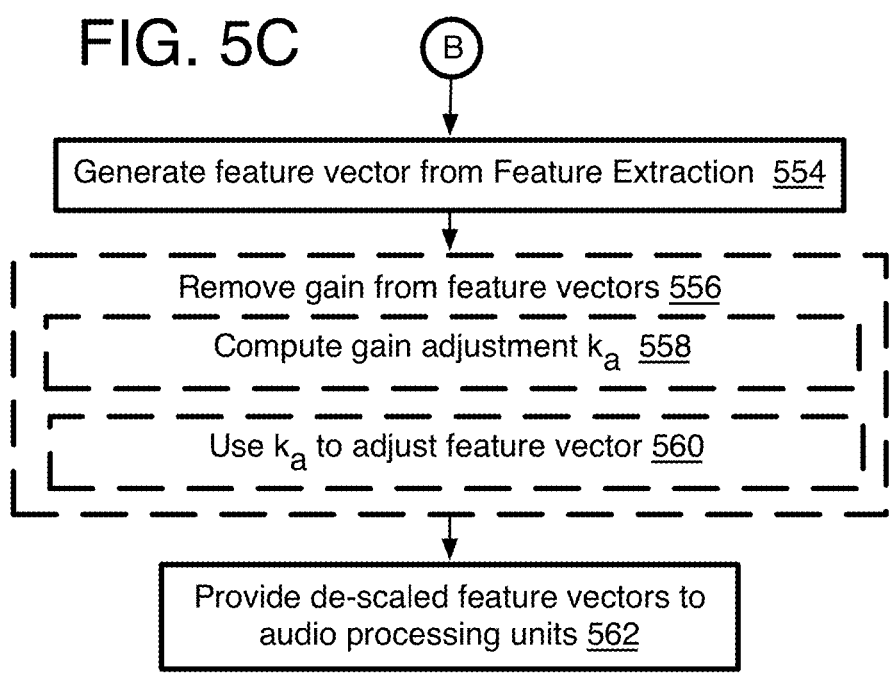

Reshape layer operation:

METHOD AND SYSTEM OF AUDIO INPUT BIT-SIZE CONVERSION FOR AUDIO PROCESSING

BACKGROUND

A number of automatic speech recognition (ASR) techniques exist that are used on small electronic or computer devices. To name one example, this may include keyphrase detection (such as Wake-on-Voice), or hot word detection systems used to detect a word or phrase or the like, which may initiate an activity by a device. For example, the device may wake by transitioning from a low power or sleep mode to an active mode, and/or may wake a particular computer program such as a personal assistant (PA) application. In this case, the detection of a waking keyphrase may activate an automatic speech recognition application to understand a command incoming from a user. For example, a user may state "Alexa, what is the weather?" where the word "Alexa" is the waking keyphrase.

The efficiency and accuracy of such ASR applications has been increased by adopting neural network techniques often operated by fixed function hardware accelerators for example. Older techniques required the use of digital signal processors (DSPs) or general-purpose computer processing units (CPUs) which is much less efficient. Such efficiency could be so low, or power consumption so high, for ASR applications that ASR could not be operated on a small stand-alone device. Some ASR techniques have attained this goal and use neural networks for feature extraction, acoustic scoring, and/or decoding. However, while much of the operation of the ASR process can be operated in such a way, a DSP often is still needed in order to perform complex conversion algorithms to convert different bit-depths (or sample bit-sizes) of an input audio signal into the bit-depth required by the ASR application and hardware. Thus, for example, 24-bit audio samples from a digital microphone (DMIC) often needs to be converted into 16-bit samples for compatibility with the ASR applications. Such conversion, when performed by a DSP, undesirably lowers efficiency, and/or raises power consumption on a computing device.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 5A-5C is a flow chart of a detailed method of audio input sample bit-size conversion according to at least one of the implementations herein;

DETAILED DESCRIPTION

Figure 1:
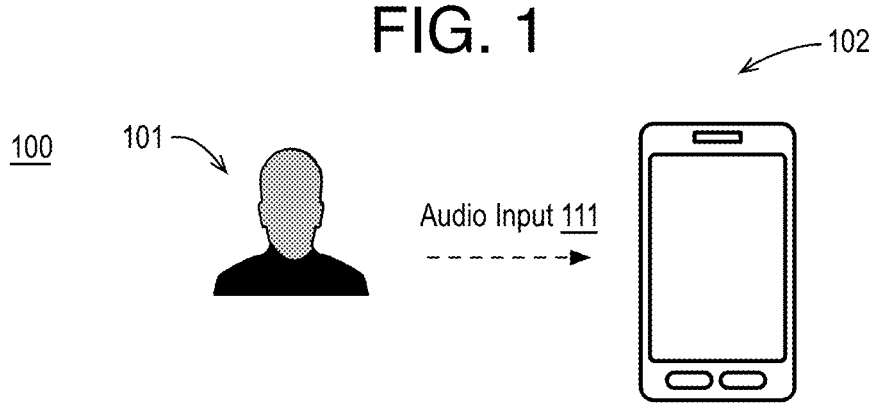
FIG. 1 is a diagram of an example setting in which audio processing is performed.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein also may be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes, except for those structures disclosed herein. For instance, various architectures employing, for example, multiple integrated circuit (IC) chips (e.g., including optionally digital signal processors but otherwise fixed function hardware such as neural network accelerators, or the like) and/or packages, and/or various computing devices and/or consumer electronic (CE) devices such as set top boxes, smart phones, smart speakers, automobile systems, security systems, or any other device or system that can implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof unless described otherwise, where an alternative implementation may be limited to a neural network accelerator (NNA) for example. The material disclosed herein also may be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every implementation may not necessarily include the particular feature, structure, or characteristic. Moreover, such phrases are not necessarily referring to the same implementation. Further, when a particular feature, structure, or characteristic is described in connection with an implementation, it is submitted that it is within the knowledge of one skilled in the art to affect such feature, structure, or characteristic in connection with other implementations whether or not explicitly described herein.

Methods, devices, systems, apparatuses, computing platforms, and articles are described herein related to audio input bit-size conversion for audio processing.

As mentioned, many automatic speech recognition (ASR) systems such as virtual assistants are not directly compatible with digital audio signals or other high quality audio signals with relatively large input sample bit-sizes such as 24 bits. This is particularly problematic with keyphrase detection (KPD) systems (also referred to as keyword detection (KWD)) that use a key phrase to wake a device to have the virtual assistant receive a request from a user. A KPD system may be "always on" and therefore consumes at least some minimal amount of power and resources at all times, which is especially important in battery-powered devices like laptops, smartphones, smart speakers, and so forth.

Related to this, some all-neural network systems were developed to reduce resource and power consumption, and use hardware accelerators improved for efficient matrix operations. An example of such a system is a Gaussian mixture model & neural network accelerator (GNA) system developed by Intel and similar systems. These systems use neural networks rather than a digital signal processor (DSP) for feature extraction, acoustic scoring, and decoding in the ASR process. However, these all-neural network systems often use accelerators that only accept samples or vectors of a certain bit-size such as a maximum of 16-bit vector inputs. Unfortunately, such a system cannot be connected directly to DMICs and other high definition microphone and audio reception systems which produce 24-bit samples. 24-bit depth dynamic audio is often needed to adequately analyze a large range of distances between the user (or source) and the device because a signal level is proportional to the distance squared and a larger bit-width increases the margin capacity between the lowest and highest level of processed signal, making it more accurate.

Conventional pre-processing of such high-definition (or high resolution) signals from a digital microphone (for example: beamforming, noise reduction, de-reverberation, and so forth) and conversion into 16-bit audio signal samples can be performed with adequate bit-size conversion. These conventional systems often require complex algorithms that increase power consumption and, in most cases, must be executed on a digital signal processor due to their complexity. The use of a DSP is not nearly as efficient as processors such as neural network accelerators.

In less efficient conventional audio input sample bit-size conversion, the conventional audio system will reduce resolution of a digital microphone input signals to 16 bits by dropping the least significant byte(s). This technique drops bits from the original or initial audio samples, thereby reducing the quality (or accuracy) of the audio processing such as KPD or other speech processing system. Since audio information is lost, this results in a decrease of speech detection performance, especially for low amplitude signals and far-field conditions.

To resolve these issues, the present method and system uses an audio input sample bit-size conversion technique that can be performed by a neural network accelerator when available and to add to the efficiency of an end-to-end neural network ASR system such as a keyphrase detection system. Specifically, the disclosed method can convert audio samples from a digital microphone in a first bit-size, such as 24-bits, into a scaled output sample of another bit-size, such as 16-bits, and that can be used for further audio processing such as ASR or keyphrase detection. Output herein refers to output from a bit-size conversion unit. Also, it should be noted herein that ASR and keyphrase detection refers to the recognition or detection of any targeted sound including any part of speech or part of a word, a whole word, phrase, sentence, and so forth.

The disclosed method accomplishes this by first dividing the input initial sample into multiple sample parts each with a bit-size compatible with the audio processing systems, such as 16 bits. By one example, at least one of the sample parts may hold the most significant bits (MSBs) from the initial sample and referred to as the high sample part (or just high part) while one or more other sample parts may hold the remaining bits including the least significant bits (LSBs) referred to as the low sample part (or low part) so that at least initially, no bits are lost from the initial sample. A larger bit-size container (or transition sample), such as 32 bits, may be used to form the multiple sample parts so that neural network accelerators can be used for this operation to arrange the sample parts. By one form, the sample parts are deinterleaved into two separate sample vectors: a high sample vector with all high sample parts and a low sample vector with all low sample parts. This allows a neural network accelerator to handle each sample vector separately to have the capacity to keep more information from the source stream for higher resolution audio.

Then absolute values of the sample parts are formed as well as a separate sign vector in order to apply a gain or weight to the sample parts. The negative sign should be removed before the gains are applied so that the sign bit in each sample part does not affect an estimation of the count of maximum bits used. The sign can be preserved and reattached to the resulting scaled output sample later. The sign affects the count because 'two's complement' binary signed number representation may be used here. In this system, when a number is negative, it has a higher MSB set to 1 to indicate a negative value. The remaining bits are treated as before with positive values. Thus, the negative sign is incompatible with the proposed solution which checks for MSBs cleared to 0. Moreover, by one example form, all of the samples should be unsigned to estimate which sample has the largest magnitude. This is performed by Max Pool operation described below.

A gain (or weight or scale factor) is then applied to each of the high and low sample parts. By one form, the gains are set by using a count of the number of bits that are used in the high sample part with the largest value among all high sample parts in a group or set of N samples, such as about 400 samples by one example. The same gains then may be used for all samples in the sample set. The gains are arranged to weigh the MSBs more than the LSBs to increase the value of the high sample parts, and in turn the resulting output samples. The greater the values of the output sample, the greater the distribution of sample values that can be input to a neural network for later audio processing such as feature extraction, which increases the precision and sensitivity of the neural network, and therefore the accuracy of the output of the neural network.

In addition, the gains effectively cause a bit shift in the resulting scaled sample so that the high sample part is filled to the highest available bit space ($2^{14}$) in a scaled high sample part. This allows space in the lower bit spaces of the high sample part to receive bits from the low sample part when the high and low sample parts are being summed to form a scaled output sample. A further adjustment or scaling factor may be applied to a low sample part to align some of the bits of the low sample part with the empty bit spaces of the high sample part with the bits of the low sample part to form a scaled low sample part so that when the scaled high and low sample parts are combined, a scaled output sample will be filled from both scaled high and low sample parts, thereby still providing LSBs from the low sample part with at least some representation in the resulting scaled output sample. This provides even more precision and accuracy for the scaled output samples, which is greatly increased over conventional methods that simply truncate the initial sample by dropping the last byte.

Thereafter, a separate sign vector maintaining the sign (positive or negative) of the initial sample and at least portions of the scaled sample parts may be re-combined to form a single scaled, converted or output, sample having the bit-size that is compatible with the audio processing system, such as 16 bits.

The disclosed method and system with highly efficient sample bit-size conversion forming highly accurate converted samples can be operated by all-neural network accelerator components, notably affine transforms (or layers), 1D convolution operations, and identity operations to name a few examples and as described in detail below. A fully connected layer (or affine layer or affine transformation) is any layer (input, output, or hidden layer) where the weight matrix for that layer is mostly populated (referring to at least more than half) with non-zero values so that any output for nodes on that layer is impacted by a significant amount of the inputs. Such a layer operation is described as an activation function of an affine transform such as:

$$y(t)=f(Ws(t)+B) \qquad (1)$$

where W is a weight matrix (or vector) that defines the layer connectivity, s(t) is the layer's input vector at time (frame) t, y(t) is the output vector at time (frame) t, B is a bias vector if present, and f( ) is the activation function for the layer.

Therefore, the conversion arrangement described herein can be made compatible with the use of an entire KPD pipeline (start-to-end neural network audio processing) performed on an autonomous version of a NN-accelerator. During the sample bit-size conversion disclosed herein, the role of DSP firmware is limited to hardware initialization and responding to interrupts when keyphrase detection occurs. Otherwise, a DSP core when present may be placed in power-reduced mode.

Such start-to-end neural network audio processes may be implemented on Intel's Gaussian mixture model and neural network accelerator (GNA) and/or autonomous neural network accelerator (ANNA) to name a few examples. Such a GNA is disclosed by U.S. Patent Publication No. 2018/0121796, published May 3, 2018, and titled Flexible Neural Network Accelerator and Methods Therefor, which is incorporated herein in its entirety for all purposes. Herein, a neural network accelerator (NNA) refers to a specific-purpose processor that is specifically arranged to process a neural network. Such an NNA at least has specific logic hardware for vectors of input data to be propagated through a neural network, input weights for nodes on the network, input bias and/or constants to be applied, a propagation circuit such as a multiply-accumulate circuit for example, and an activation function unit. By one form, the NNA has the ability to process data from a DMIC directly (e.g., without the use of a DSP to perform bit-size conversion of samples) as described herein in order to be able to run in a completely or substantially autonomous manner.

As a result, the present method and system are especially valuable when the system runs in far-field conditions and when signal amplitude is low. Also, performing the disclosed method on an autonomous hardware accelerator allows for high performance and limited resource consumption (both energy and cycles) compared to DSP implementation. These structures and methods result in a significant power-efficient solution and significantly raises audio processing power efficiency.

While the example descriptions herein mainly describe the disclosed method and system to perform sample bit-size conversion for ASR, and particularly for KPD, it will be understood that the present method and system could be used as a pre-processing operation for many different audio processing systems, and including those that use a neural network.

Referring now to FIG. 1, an example setting 100 for providing ASR such as keyphrase detection is arranged in accordance with at least some implementations of the present disclosure. The setting 100 may include a user 101 providing audio input 111 to a device 102. For example, device 102 may be in a deep sleep or power saving mode or the like, and user 101 may be attempting to wake device 102 via keyphrase detection. If user 101 provides audio input 111 that is identified as the keyphrase of device 102, device 102 may wake from a sleep or power saving mode, perform a task, or the like. For example, device 102 may provide an automatic wake on voice capability for user 101. By other examples, wake-on-voice, or more generally keyphrase detection, may refer to a situation where the device is already awake and performing other tasks, such as playing music, and the keyphrase detection triggers the waking of a specific program or application such as a personal assistant (PA) or virtual assist ant (VA) for example. In such a case, the keyphrase detection may wake an automatic speech recognition (ASR) application to understand a command or request to instruct the PA to perform a task. Alternatively, instead of a general-knowledge PA, a specific audio application that receives specific commands may be listening such as that awaiting commands to place a telephone call, for example.

Otherwise, for large vocabulary ASR, the user 102 may be asking a PA a question or may be requesting information, where the ASR application will need to recognize the language to understand the request and provide a relevant answer to the user. By other alternatives, the user may be using device 102 as a dictation device such that the ASR application must recognize the user's language in order to convert the audio speech into written text on an application on device 102 that provides a textual interface for example. As will be understood from the descriptions herein, the present method and system can be used for any of these applications, and many other applications that analyze audio signals and require a sampling of the signal.

As shown, in some examples, an ASR or audio processing system may be implemented via device 102 such that device 102 may be a smartphone. However, device 102 may be any suitable device that handles such audio processing as described herein such as a smart speaker, computer, a laptop, an ultrabook, a smartphone, a tablet, a phablet, a wearable device such as a smart watch, smart headphones, or eye glasses, or the like. In any case, device 102 may be described as a computing device as used herein.

Figure 2:
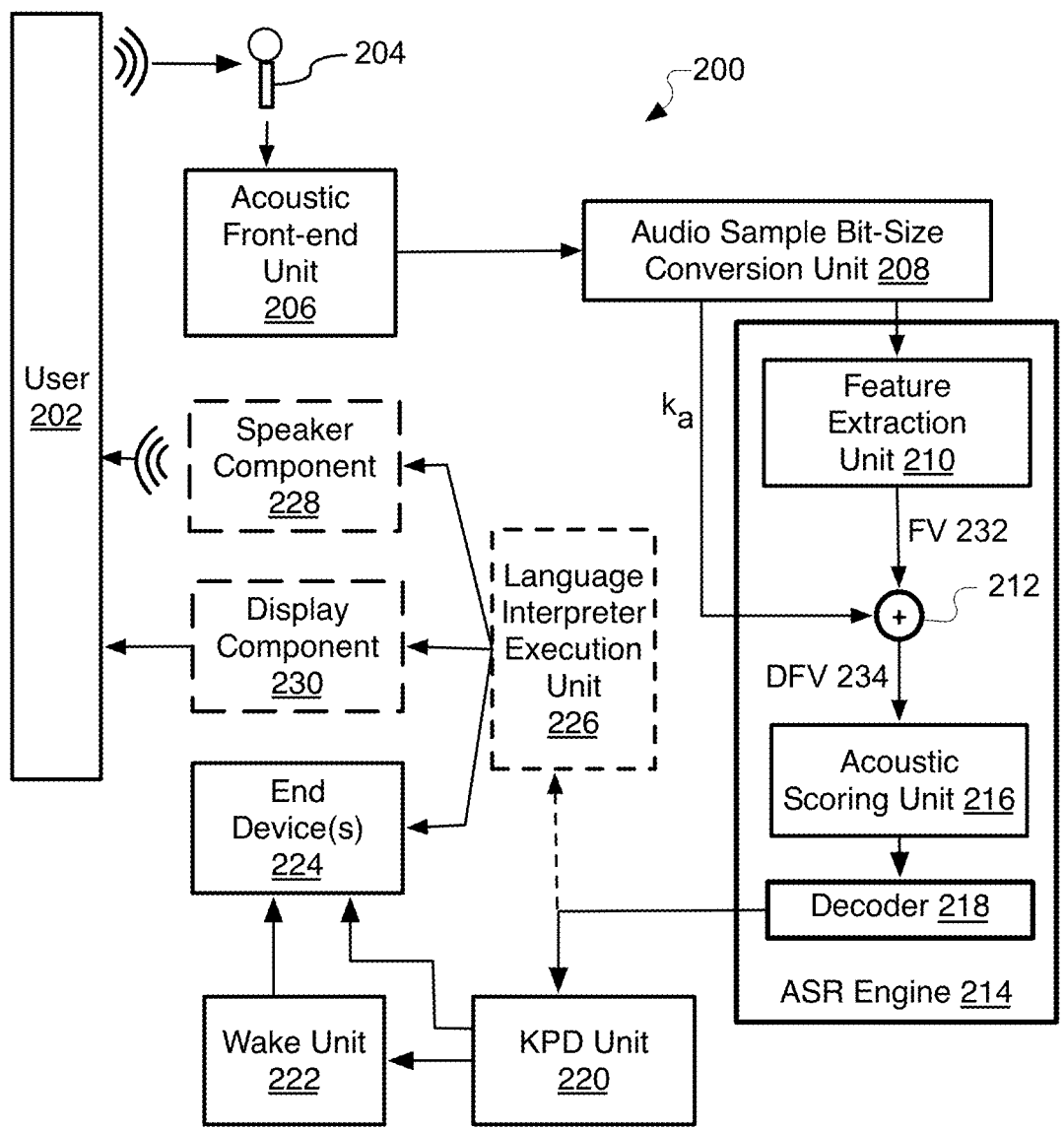
FIG. 2 is a schematic diagram of an audio processing system according to at least one of the implementations herein.

Referring to FIG. 2, an example audio processing system 200, which may reside on device 102 (FIG. 1), for ASR is shown here as one example of the type of system that can use the disclosed audio sample bit-size conversion and is arranged in accordance with at least some implementations of the present disclosure. System 200 may include, or be communicatively connected to, one or more audio capture or receiving devices 204 such as a microphone or array of microphones, for example, an acoustic front-end unit 206, an audio sample bit-size conversion unit 208 disclosed herein in detail below, an ASR engine 214 with a feature extraction unit 210, adjuster 212 to compensate for changes by the conversion unit 208, an acoustic scoring unit 216, and a decoder 218. The system 200 also may optionally provide a KPD unit 220, a wake unit 222, and/or a language interpreter execution unit 226 as well as an end device 224, speaker component 228, and display component 230, all described below.

Now in more detail, the microphone 204 receives sound waves from a user 202 (or 101 from FIG. 1) and converts the sound waves into a raw electrical acoustical signal that may be recorded in a memory. Audio input received by the microphone 204 may include any speech issued by user 202 and any other background noise or silence or the like in the environment of microphone 204. Audio input may be characterized as audio, input audio, an input speech stream, or the like.

By one form, the microphone 204 may be connected directly through a two wire digital interface such as a pulse density modulation (PDM) interface to name one example. In this case, a digital signal is directly fed to an acoustic front end 206. The digital signal also may be provided by other structures or circuits and is not particularly limited. The acoustic front-end unit 206 may perform pre-processing which may include signal conditioning, noise cancelling, sampling rate conversion, signal equalization, and/or pre-emphasis filtration to flatten the signal. The acoustic front-end unit 206 also may divide the acoustic signal into frames or initial samples, by 10 ms or 30 ms frames by some examples. The digital initial samples here may be provided in raw form and then maintained after pre-processing mentioned above in 24-bit values to provide high definition (or high resolution) audio quality.

The initial samples then may be provided to an audio input bit-size conversion (AIBC) unit, or just conversion unit, 208 to convert the initial samples from a first bit-size, such as 24 bits, to a second bit-size such as 16 bits, for compatibility with the following ASR units. The conversion unit 208 may be considered part of the acoustic front-end unit 206 or ASR engine 214 or neither. As disclosed in detail below, the conversion unit 208 converts the sample sizes in a highly efficient manner and forms highly accurate converted samples, all without the use of a DSP. To accomplish this, the conversion unit 208 may convert each input or initial sample of a first bit-size into a transition sample or container with a size that is a larger bit-size than the initial sample. The transition sample is then divided into sample parts each with a bit-size compatible with the ASR units, and a gain is applied to absolute value versions of the sample parts to form scaled sample parts. A sign vector is also created to maintain the sign of the initial sample. At least portions of the sample parts and the sign vector are then recombined to form a scaled output sample of the compatible bit-size to provide for further audio processing. Such an audio sample bit-size conversion unit 208 is described in detail as conversion unit 300 (FIG. 3) below. For ASR or KPD, the output of the conversion unit 208 is a scaled sample that is provided to the feature extraction unit 210.

The feature extraction unit 210 may be considered part of the ASR engine, the acoustic front end 206, both, or neither. A conventional version of the feature extraction unit 210 extracts acoustic features or feature vectors from the acoustic signal (or scaled samples in this case) using Fourier transforms and so forth to identify phonemes provided in the signal. Alternatively, a feature extraction unit 210 that avoids the use of a DSP and mainly operates by neural network accelerator instead is disclosed by U.S. Patent Publication No.: 2019/0043477, published on Feb. 7, 2019, and titled "Method and System of Temporal-Domain Feature Extraction for Automatic Speech Recognition", which is incorporated herein in its entirety for all purposes. This technique for feature extraction unit 210 may generate acoustic features or feature vectors in the form of mel-frequency spectral coefficients (MFSC) or cepstrum coefficients (MFCC) without the use of a DSP. This feature extraction unit 210 also may perform other tasks that avoid the use of a DSP such as providing linear prediction, additives such as energy measures, delta and acceleration coefficients, and application of weight functions, feature vector stacking and transformations, dimensionality reduction and normalization.

Feature extraction unit 210 may generate feature vectors (FV) 232 that may be or include any suitable features or feature vectors or the like representing the audio input samples, and as mentioned above, may be provided without the use of a DSP by using specific-purpose hardware and/or a neural network accelerator instead as mentioned above. For the example where the DSP is avoided, a time series of feature vectors (e.g., feature vectors each generated for an instance of time) may be used such that each of the feature vectors includes a stack of features. Specifically, feature vectors from the feature extraction unit 210 may be provided at multiple sampling times in the form of the (MFCCs) mentioned above or the like may be generated. The sampling times may be at any suitable interval such as every 10 ms or the like, and the sampling performed at each sampling time may sample any duration of input speech or audio such as 25 ms of audio or the like. The coefficients of the feature vectors may include any number of sampling coefficients but is usually related to the mel-frequency scale and may include such as 13 to 40 coefficients by one example. Furthermore, the coefficients may each be referred to as features, a feature vector, a sampling, or the like. By one example, the non-DSP feature extraction is used as mentioned above and by using the non-FFT and an energy operation accumulation approach. For the other example mentioned above, DSPs may be used when using a Fourier transform of audio input and/or audio received via microphone 204. Either way, the feature extraction unit 210 also may perform mapping to the Mel scale, determining logs of the powers at each Mel frequency, and determining the Mel frequency cepstrum coefficients based on a discrete cosine transform (DCT) of the logs of the powers.

The sampling coefficients may be stacked or concatenated or combined or the like to generate feature vectors 232 after being normalized or the like by cepstral mean normalization or the like to generate the coefficients for example. The coefficients may be combined to generate each feature vector 232 such that each feature vector is a 143 (e.g., 11×13) dimensional vector by one possible example. However, any number of instances of sampling coefficients may be combined or stacked to generate feature vectors 232. The feature vectors 232 may include sampling coefficients with overlapping time ranges such that a first feature vector may be associated with times $t_0$-$t_{10}$, while a next feature vector may include sampling coefficients associated with times $t_1$-$t_{11}$ for example. By one example, the feature vectors (FV) 232 may have the form of 16-bit values in fixed-point representation, with known number of fractional bits (Q-factor). Resulting features should be log-proportional to the level of input signal (MFSC, MFCC, etc.).

An adjuster (or adder or subtractor) 212 then adjusts each of the feature vectors by applying a gain or scaling compensation value or vector $k_a$ that removes the effect or offset of the gains applied to the sample vectors before forming and providing the scaled sample to the feature extractor unit 210 in the first place. This results in the removal of the scaling as if the scaling had not been applied, and results in de-scaled feature vectors DFV 234. This is performed because features calculated from scaled sample vectors are biased such that subsequent ASR and KPD computations would have incorrect results. Moreover, the scaling may change rapidly among sample group windows so that the scaling may introduce an undesired variance of feature values that is not present in the input signal. This arrangement also permits the bit-cost conversion to be used with already implemented feature extraction modules that are not customized for dynamic scaling features as described.

The de-scaled feature vectors (DFV) 234 are then provided to the acoustic scoring unit 216, which also may or may not be considered part of the ASR engine 214. The acoustic scoring unit 216 may use acoustic models to determine a probability score for context dependent phonemes that are to be identified, where the model may be a deep neural network (DNN) pretrained based on a training set of audio samples. The acoustic scoring may be performed by using any suitable neural network such as an artificial neural network, a deep neural network (DNN), a convolutional neural network (CNN), a time delay neural network (TDNN), or the like. In some examples, the neural network for acoustic scoring may implement Hidden Markov Models (HMMs). Resulting output acoustic scores from the acoustic scoring unit 216 may be characterized as scores, probabilities, scores of sub-phonetic units, probability density function scores (PDFs), or the like. For example, acoustic scoring unit 216 may generate such output scores or states for each of de-scaled feature vectors 234 to generate a time series of acoustic scores.

The acoustic scores then may be provided to a decoder 218. This may be a large vocabulary ASR decoder such as a weighted finite state transducer (WFST), or may be a specialized keyphrase or keyword detection decoder (KPD (or KWD) decoder). A KPD decoder for an all-neural network solution has been described in U.S. Patent Publication No. 2019/0043488, published Feb. 7, 2019, and titled "Method and System of Neural Network Keyphrase Detection", which is incorporated herein in its entirety for all purposes. This KPD decoder performs vectorized operations, and such a vector and sub-phonetic-based data structure for a keyphrase detection decoder is disclosed by U.S. Pat. No. 10,083,689, issued on Sep. 25, 2018 and titled "Linear Scoring For Low Power Wake On Voice", which is incorporated herein in its entirety for all purposes as well.

When the decoder 218 is, or may have, a KPD decoder, the decoder 218 may provide one or more keyphrase scores (or value(s) based on a keyphrase score) to a KPD or control unit 220. The keyphrase detection decoder may accomplish this by receiving and implementing a keyphrase model (or multiple keyphrase models) and a rejection model.

Based on one or more final keyphrase scores (e.g., if a keyphrase score is greater than a threshold or the like), the KPD unit 220 may provide an indicator to a system wake unit 222 (e.g., if a keyphrase score indicates a predetermined keyphrase or one of several predetermined keyphrases has been matched). The wake unit 222 then will wake the appropriate application such as a PA. In some examples, the KPD unit 220 also may provide a system command associated with the keyphrase to request end device(s) 224 to perform an operation such as starting an application, generating or retrieving data, or the like. In some forms, the KPD unit 220 may perform, or may be associated with, voice activation and start and/or end point speech detection.

When the decoder 218 is, or has, a large vocabulary decoder, the decoder generates hypothesis phrases each with scores that are then provided to the language interpreter execution unit 226. The language interpreter execution unit 226 determines which of the phrases is the correct phrase. Depending on the phrase, an end device 224 may be activated to perform further actions, such as a PA answering a question or finding information requested by the phrase. Otherwise, the phrase may be displayed by a display component 230 such as with a dictation program or may be spoken such as with a speaker component 228. Many other actions can be performed depending on the resulting recognized phrase and is not particularly limited here.

In some implementations, conversion unit 208, feature extraction unit 210, acoustic scoring unit 216, and decoder 218 are performed on at least one neural network accelerator and dedicated specific-purpose hardware rather than a digital signal processor (DSP). Thus, one advantage of the audio processing system 200 is that it avoids a separate DSP operation of each of these modules so that no "compute" distinction exists between the bit-size conversion, feature extraction, acoustic scoring, and decoding. In other words, and generally speaking, the results of neural network layers of one of the modules can be input to neural network layers of the next module without separate operations to provide the data to a DSP for calculations. The result is autonomous neural network acceleration able to substantially provide ASR or keyphrase detection without substantial reliance on other processor units thereby reducing computational loads and power consumption which improves the functions of small computing devices and "always on" devices to name a few examples. By other alternatives, at least the bit-size conversion is performed by the NNA while a DSP may be used for operation of any one or more of the other units.

Figure 3:
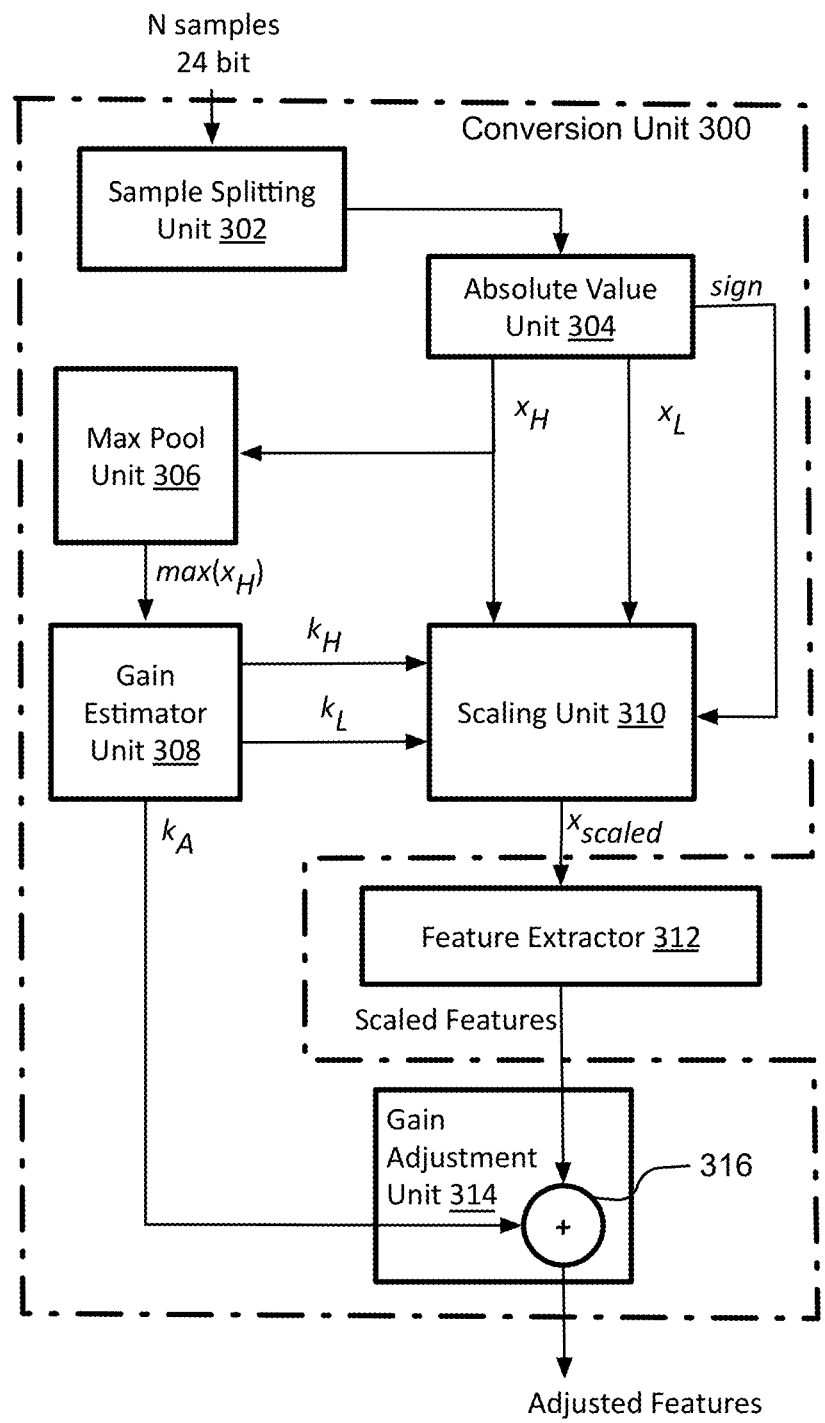
FIG. 3 is a schematic diagram of an example audio input sample bit-size conversion system according to at least one of the implementations described herein.

Referring to FIG. 3, an audio input bit-size conversion system or device (or conversion unit) 300 is shown, the same or similar to the AIBC unit 208, and may perform the bit-size conversion methods disclosed herein. The conversion unit 300 may have a sample splitting unit 302, absolute value unit 304, max pool unit 306, gain estimator unit 308, scaling unit 310, feature extractor unit 312, and gain adjustment unit 314 that has an adjuster (or adder/subtractor) 316. It will be understood that feature extractor 312 could be considered a unit separate from the conversion unit 300 either alone or as part of an ASR engine.

The sample splitting unit 302 divides the initial samples into sample parts by using a transition sample or container that is larger than initial samples. The transition sample has a bit-size, such as 32 bits, conveniently divisible into sample parts each of the desired bit size, such as 16-bits, and that can be accomplished by use of a neural network accelerator rather than a DSP. In one example, one of the sample parts holds the MSBs of the initial sample being analyzed and at least one other of the sample parts holds the LSBs of the initial sample being analyzed. By one approach, the division generates two separate sample vectors for an entire sample set or group. This results in LSB sample parts from multiple transition samples being placed together in a low sample vector while the MSB sample parts of the multiple transition samples are placed together in a high sample vector. This makes it more efficient for an NNA to operate differently on each of the sample vectors. The splitting unit 302 also shifts the low sample parts to reserve a highest bit (at $2^{15}$ here) to indicate a sign but is set at zero (which indicates positive or unsigned).

The absolute value unit 304 then generates the absolute value versions of the high and low sample parts as well as a sign vector to maintain the sign of the initial sample, again by using neural network accelerator operations.

The max pool unit 306 next determines the sample part with the largest numerical value among a group or set of samples, such as N=400 or N=416, and by using maximum pooling as performed by a neural network accelerator. By this approach, only the high sample parts need to be analyzed.

The gain estimator unit 308 uses the sample part with the maximum value to generate gains or weights for each of the sample parts of the current sample set. The gains are based on the magnitude of the sample part (e.g., how many digits of the 16 bits are occupied or in other words, the number of bits spaces from 0 to the highest bit space with a '1' in the sample part). A separate low gain and high gain may be formed for the low sample part and high sample part, respectively, and as described below.

Thereafter, the scaling unit 310 applies the gains to the absolute value sample parts and generates a scaled output sample. This is accomplished by recombining at least portions of the scaled sample parts and applying the sign (in the form of the sign vector by one example) to the resulting recombination. This results in a signed scaled sample (or converted sample or scaled output sample) of the desired 16 bit depth.

The feature extractor 312 receives the scaled output samples, one for each initial sample, and extracts features to form a feature vector as described herein. The feature vector, however, is scaled due to the application of the scaling by the conversion unit 300. Thus, the gain adjustment unit 314 may have an adjuster (or adder/subtractor) 316 to de-scale the feature vector (or scaled features). This is performed by applying a gain adjustment $k_a$ to the scaled feature vector and that is biased based on the offsets of the gains applied to the sample parts and known properties of transformation performed by the feature extractor (312). The $k_A$ coefficient corresponds to a scale factor applied in scaling unit (310). The scaled features produced by feature extractor (312) are therefore biased as well because of the scaling applied by the scaling unit (310). To return features to the correct signal or value level, as if the scaling did not happen, the gain adjustment unit (314) subtracts the $k_A$ coefficient from each or individual element in the scaled features vector because multiplication by a constant corresponds to addition in a logarithmic domain, as here. Feature extraction algorithms for ASR calculate in logarithm internally. The resulting de-scaled adjusted features or feature vector is then provided to an acoustic scoring unit for ASR or KPD for example, or for other audio processing operations.

By one alternative, an NNA is used to perform all of the operations of the conversion unit 300 as mentioned above (except hardware initialization for example). By another alternative, at least the gain generation is performed by an NNA, while any combination of one or more of the other operations of the conversion unit 300 may be performed by a DSP. The units or modules forming the units of conversion unit 300 mentioned above as well as the details of the operation of these are described below with the operation of processes 400 and 500.

Figure 4:
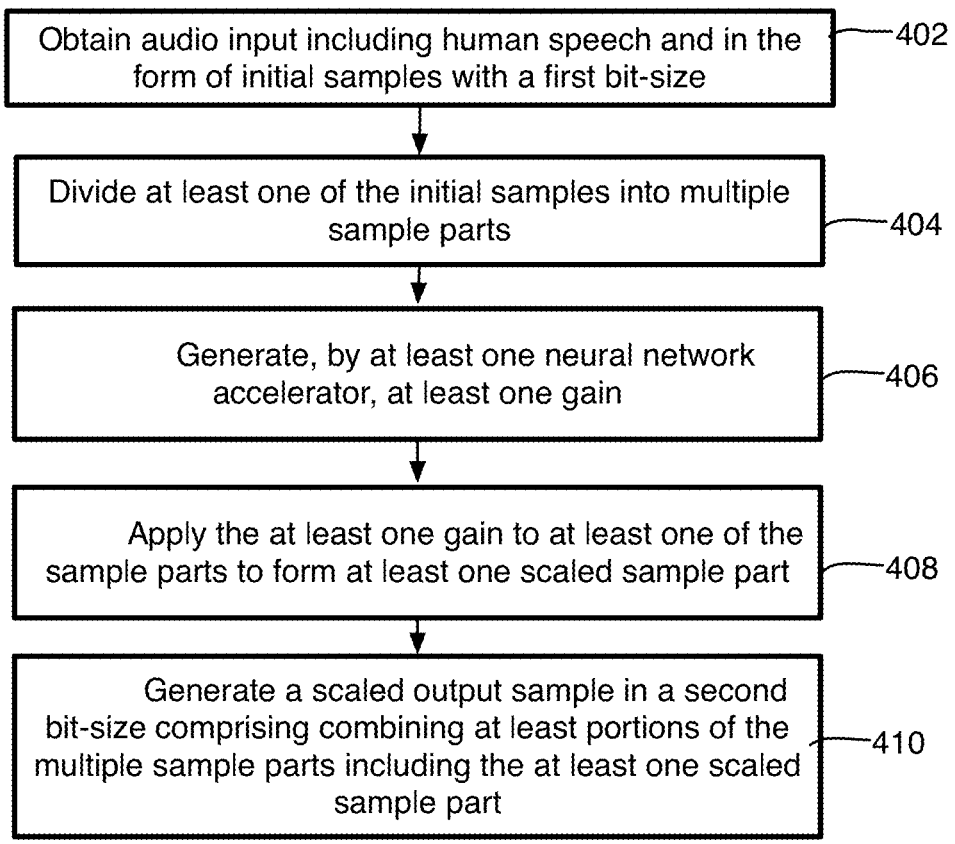
FIG. 4 is a flow chart of a method of audio input bit-size conversion according to at least one of the implementations herein.

Referring now to FIG. 4, an example process 400 for audio input sample bit-size conversion for audio processing is arranged in accordance with at least some implementations of the present disclosure. Process 400 may include one or more operations 402-410 as illustrated in FIG. 4. Furthermore, process 400 will be described herein in reference to systems 200, 300, or 2100 of FIG. 2, 3, or 21 respectively, and where relevant.

Process 400 may include "obtain audio input including human speech and in the form of initial samples with a first bit-size" 402. Thus, audio for ASR, KPD, or other audio processing may be obtained from storage or one or more microphones, and by one example, with samples in a bit-size for high definition or high resolution audio, such as 24 bits. Such samples may be consecutive non-overlapping samples along an audio signal or may be overlapping signals such as 25 ms samples with 10 ms overlaps by one example. Many other examples exist. The audio may have received pre-processing and/or front-end processing so that the samples are at least sufficiently formatted for the bit-size conversion herein.

Process 400 may include "divide at least one of the initial samples into multiple sample parts" 404, and by one form, this is performed by an NNA. By splitting the initial samples into multiple sample parts, at least one sample part can be provided for MSBs of the initial part and at least one part can be provided for LSBs of the initial part, and each can be treated differently before recombining the sample parts to form an output sample. By one form, the sample parts may be the same bit-size as the desired bit-size of the output sample, such as 16-bits.

By one form, the initial sample parts are formed by first placing each initial sample in a container for a transition sample that is larger than the initial sample, such as 32-bits, and can be divided evenly into sample parts of a bit-size that is the same as the bit-size of the output sample, such as 16-bits. These transition samples can be placed consecutively into an input buffer array of a NNA for example, forming an input vector. The input vector can then be deinterleaved to place all low sample parts in one low sample vector and all high sample parts into a high sample vector. An NNA can then process and treat each sample vector differently and more efficiently. The details are provided below.

By one form, the sample parts are also provided as an absolute value version of the sample parts. This is accomplished by generating a separate sign vector that preserves the sign of the initial sample and that can be applied later to form the output sample. The absolute value versions of the low and high sample vectors can be formed as described below.

Process 400 may include "generate, by at least one neural network accelerator, at least one gain" 406. By one approach, an NNA will provide more accurate results when the input values of the sample parts forming the output sample are larger. With more bits in the bit spaces of the sample parts (rather than zeros), the sample parts provide a larger distribution of values. The larger the distribution, the greater the accuracy of a neural network. To accomplish this increase in value, gains may be generated dynamically depending on the values of the sample parts, and to increase the value of MSBs in high sample parts while decreasing the value of LSBs in low sample parts. An NNA may be used to generate the gains.

By one form, to further increase the value of the sample parts, the gains depend on the largest value of the sample parts among a set of the sample parts (or from a set of the initial samples), such as N equal to about 400 initial samples, and in turn, about 400 high sample parts. An NNA may use max pooling to determine the largest value or highest sample part to avoid the use of a DSP by one example. The gains themselves may depend on a count of how many bit spaces are being used in one of the sample parts, and by one example, in the high sample part with the largest value (although other sample parts could be used such as median sample part). By one form, both a high and low gain to be applied to high and low sample parts of the set of samples depend on the same count and is set to proportionately increase the value of the high sample part and decrease the value of the low sample part. By one form, the gains for the high and low sample parts are the same for all sample parts of a set of the samples.

Process 400 may include "apply the at least one gain to at least one of the sample parts to form at least one scaled sample part" 408. The gains may be applied by multiplying the gain by the absolute value of the sample parts to generate scaled sample parts. Specifically, in order to increase the value of the high sample part, and in turn the combined sample, and to provide better representation of LSBs from the low sample part, the gain acts as a bit shift to move the MSB of the value on the high sample part to occupy the highest bit space (or largest bit space number) available. Not only does this increase the value of the high sample part, but it also creates empty bit spaces at the end or bottom of the high sample part that can be filled by bits from the low sample part during the scaling operation. Thus, a further shift operation is performed on the low sample part so that the highest bits on the low sample part are aligned with the empty spaces on the high sample part to fill the empty bits when the scaled high and low sample parts are summed. Other bits of the low sample part may be computed or used instead. This operation also may be performed by an NNA, and by one form, entirely by an NNA rather than a DSP.

Thus, process 400 may include "generate a scaled output sample in a second bit size comprising combining at least portions of the multiple sample parts including the at least one scaled sample part" 410. Here, the scaled high and low sample parts may be combined by summing them. This places the highest bits of the low sample part into the empty spaces left by the high sample part to form a single absolute value scaled sample. The sign vector mentioned above then may be applied to reattach the sign of the initial sample to form the final scaled and signed output sample here. More detail is provided below.

The scaled output sample then may be provided for further audio processing such as for feature extraction for ASR or KPD operations for example. By one form, when feature extraction receives the output samples, the resulting output feature vectors generated by the feature extraction and to be provided to ASR or KPD acoustic scoring may first be de-scaled by applying an adjustment factor $k_4$. The adjustment factor corresponds to scaling offsets applied by the gains to the sample parts, and the adjustment factor removes at least some of the scaling of the output samples (or here on the feature vectors). As mentioned above, this is performed because features calculated from scaled sample vectors are biased such that subsequent ASR and KPD computations would have incorrect results. Moreover, the scaling may change rapidly among sample group windows, so that the scaling may introduce an undesired variance of feature values that is not present in the input signal. This also permits the bit-cost conversion to be used with already implemented feature extraction modules that are not customized for dynamic scaling features as described.

It will be understood that one or more of the operations of process 400 may be performed by a neural network accelerator that has specific-purpose hardware to run one or more neural network layers rather than a DSP or other similar less efficient processor. By one form, all of the operations of the bit-size conversion mentioned herein are performed by at least one NNA rather than a DSP.

Figure 5B:
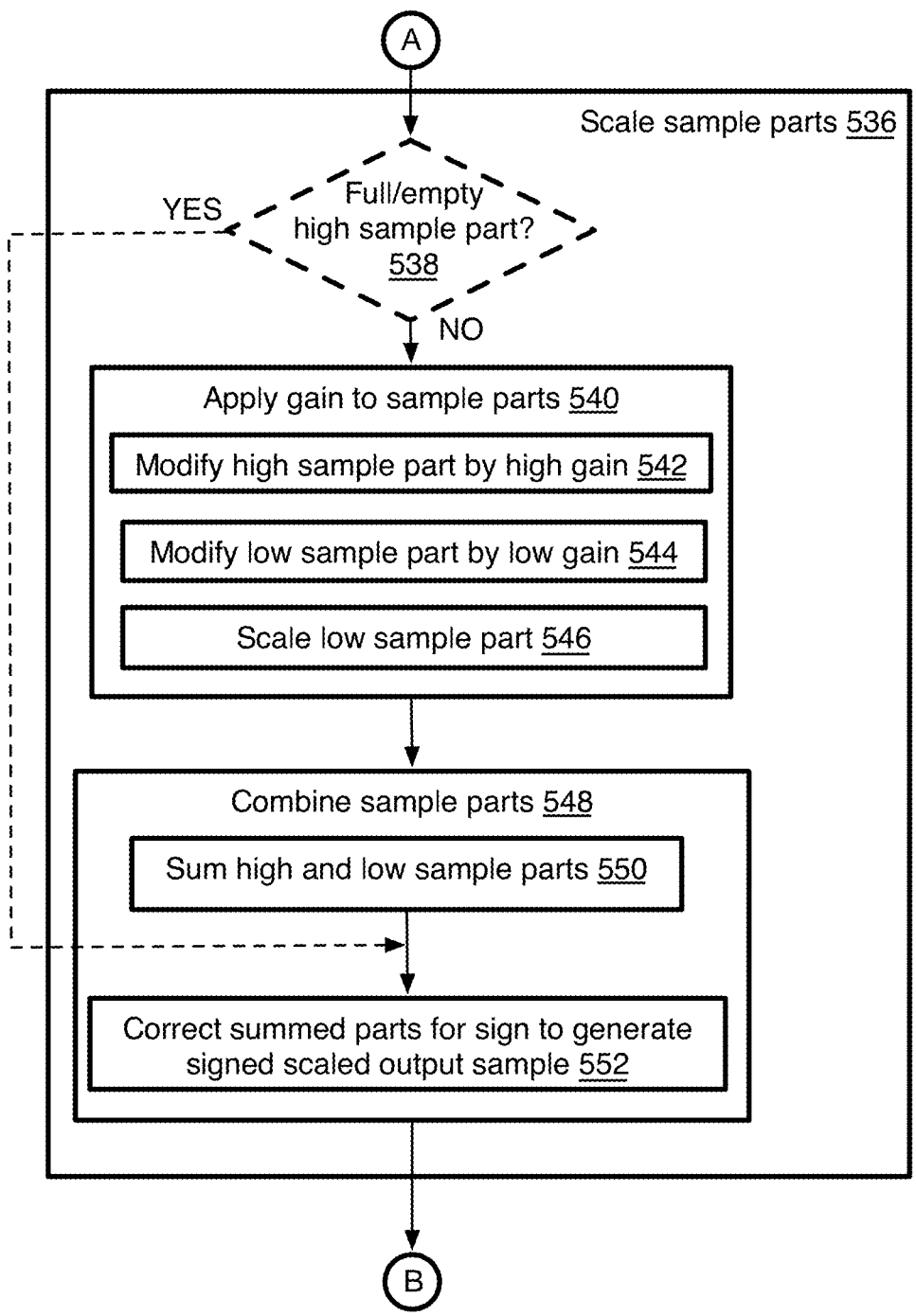

Referring to FIGS. 5A-5C, an example process 500 for audio input bit-size conversion for audio processing is arranged in accordance with at least some implementations of the present disclosure. Process 500 may include one or more operations 502-562, generally numbered evenly. Process 500 or portions thereof may be performed by any device or system or the like discussed herein to provide input sample bit-size conversion, and by one form as performed on a neural network to be part of an all-neural network ASR operation for example as described herein. Process 500 or portions thereof may be repeated any number of times for any number of samples to provide ASR including keyphrase detection via a device or system. Furthermore, process 500 may be described herein in reference to systems 200, 300, or 2100 of FIG. 2, 3, or 21 respectively, and where relevant.

Process 500 may include "obtain audio signal input samples in a first bit-size" 502. For this operation, an input audio signal from a microphone is segmented into data chunks (data windows) of length N samples (for example N≈400 or 416 by one example below). The data chunks may be referred to herein as groups or sets of sample data. By one form, the sample sets may be analyzed one sample set at a time, or in other words, so that one data window is processed by the components of the presented system in a single iteration. The sample (or data) sets may be defined consecutively along the input audio signal such that there is no overlap in the sample sets. By another alternative, the sample sets may overlap by some interval, or may overlap for each sample n such that samples are added in a first-in first-out (FIFO) manner to maintain a certain sample set size (such as the N=400) and so that a new sample set is formed for analysis with the addition of each sample. Other variations are contemplated as well.

Figure 6:
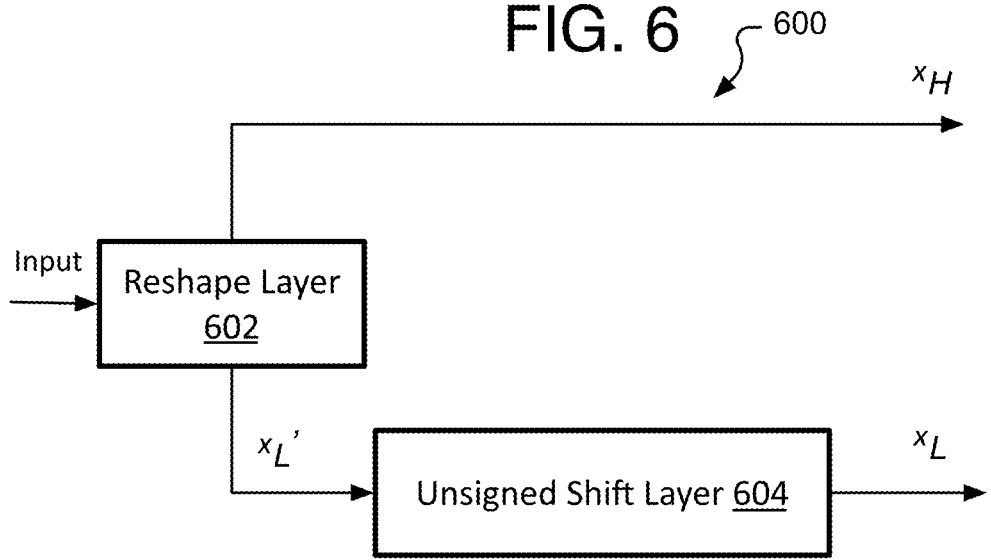
FIG. 6 is a schematic diagram of an example sample splitting unit according to at least one of the implementations described herein.
Figure 6A:
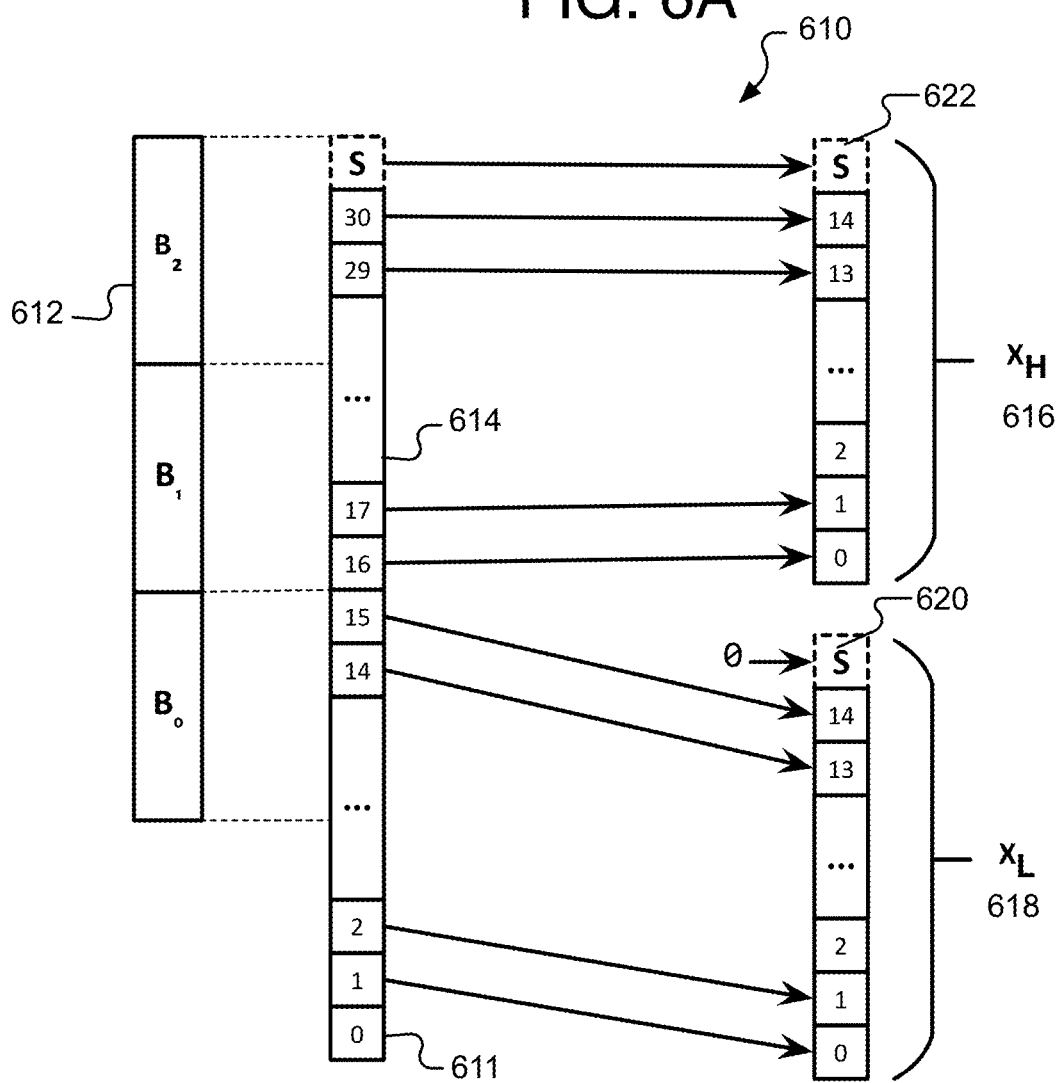
FIG. 6A is a schematic diagram of audio sample bit-size conversion according to the sample splitting unit of FIG. 6.

Referring to FIG. 6A, by one form, a digital sample has a bit-size typically used for high definition or high resolution audio, such as 24 bits. Such an initial sample 612 of 24 bits is shown with three bytes $B_0$ to $B_2$, where $B_2$ may hold the MSBs and $B_0$ holds the LSBs of the initial sample. Also, it will be understood that this operation refers to, or includes, the initial sample in a version that has been pre-processed at least sufficiently for the bit-size conversion to commence as described herein.

Process 500 may include "split samples" 504 that may be performed by the sample splitting unit 302 (FIG. 3). This operation divides the initial sample 612 into multiple sample parts, here sample parts 616 and 618, each of a desired or expected bit-size, such as 16 bits for example. Each sample part can then be treated separately and differently to increase the accuracy of the sample.

Referring to FIG. 6, the sample splitting unit 302 (FIG. 3) may be the same or similar to a sample splitting unit 600 with a reshaping layer (or unit) 602 and an unsigned shift layer (or unit) 604. The reshaping layer 602 divides the transition samples 614 into the sample parts in a way that is efficient for, and compatible with, NNA processing. The unsigned shift layer 604 shifts the bit values in the low sample part in order to reserve the highest bit space for a sign indicator S 620 (FIG. 6A). The term 'layer' is used here since these units may perform operations on a NNA rather than a DSP. The details are as follows.

Process 500 may include "place initial sample in transition container with transition bit-size" 506. Thus, the individual initial samples 612 each may be stored in a memory as 24-bit values except in a 32-bit container (also referred to as a transition container or transition sample) 614 for example. The 32-bit container may be in sign-magnitude format or two's compliment format where the highest bit (or bit space with the largest number, here 31) is reserved to indicate the sign of the transition sample value, such as (1) for negative and (0) for positive. Specifically, the 24-bit initial samples here are aligned to most significant bits (MSBs) which are the largest bit values in a binary value sample. These bits are placed in order in the transition sample 614 so the numerical value of the sample does not change (and in turn, in order of significance). In other words, for the 32 bit container 614 where the bit spaces are numbered 0 to 31, the MSBs are placed to occupy the bit spaces with the largest or highest bit space numbers in the container 614, or in other words, occupy the higher bits or bytes of the 32-bit containers. In this case, the MSB of a 24 bit sample would be placed at bit space 30. Bit space 31 is reserved for the sign bit and is copied from the highest numbered bit space of the initial sample 612. The remaining bit spaces of the 32 bit container after the LSB of the 24 bit sample (after the byte $B_0$ here) are empty and may be filled with zeros. The transition samples may be stored consecutively as an input vector in a memory or input buffer of a neural network accelerator (NNA) as described in detail below.

Process 500 may include "divide transition container into sample parts" 508. Particularly, the transition sample 614 now with 32-bit values may be divided into multiple 16-bit sample parts, shown here as sample parts 616 and 618. By one example, the two sample parts may be formed from a low (or least significant bit (LSB)) sample part $a_L$ 618 and a high (or MSB) sample part $x_H$ 616 where low and high may refer to significance of the bits as well as the space numbers in the 32 bit container. It will be understood that the transition sample 614 and sample parts 616 and 618 could be many different bit-sizes as is compatible with ASR, KPD, and/or other audio processing systems being used. Thus, it is contemplated that the transition sample 614 could be divided into more than two sample parts. By one form, the transition sample should be a bit-size that is evenly divisible into sample parts of a bit-size expected for the remaining operations of the ASR, KPD, or other audio processing systems.

Figure 7:
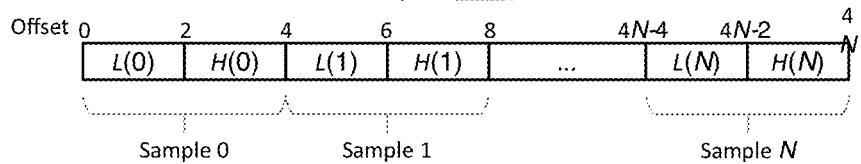
FIG. 7 is a schematic diagram of audio samples to explain a reshaping operation according to the sample splitting unit of FIG. 6.
Figure 7:
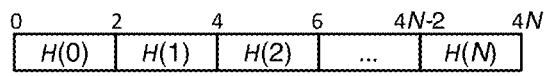
Figure 7:
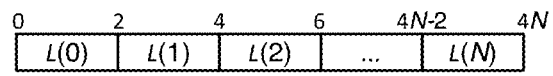

Referring to FIG. 7, process 500 may include "perform reshape layer to form low and high sample vectors" 510. By one form, the 32 bit containers (or transition samples) of the set of N samples initially may be stored consecutively to form an input vector for neural network accelerator (NNA) processing, and by one approach, to occupy one or more rows of an array at an input buffer or other memory of the NNA. By one example, each row may store 48 sample parts, or 24 samples, which can be the size of an input vector handled at one instance by an MAC of the NNA. The processing then would proceed row by row.

This arrangement, however, is inefficient when the NNA processes data on a row-major (row-by-row) basis. Particularly, the consecutive transition samples form an interleaved or alternating pattern of alternating high sample part and then low sample part as shown by input vector 702. Each sample 0 to N on input vector 702 represents a transition sample of 32 bits, and each sample has a low sample part L(n) and high sample part H(n). The offset is a count of the bytes from the start of the input vector 702 as stored in memory. If the interleaved input vector 702 of 32-bit transition samples were to be input directly to bit-size conversion NN layers, the processing of an alternating pattern of low and high sample parts is inefficient because the NNA is to treat the low sample parts differently than the high sample parts as explained below. This would cause the NNA to switch operations with each pair of sample parts. Repeating the same operations for high sample parts and then separately for low sample parts has proven much more efficient. For example, a different activation function may be applied to each type of sample part, and switching the activation function back and forth on the NNA unnecessarily consumes time and energy. For example, only MSB sample parts are processed to estimate gain because these samples have a fully used bit width compatible with architecture of the NNA so that processing all of the MSB or high sample parts consecutively is efficient. This is especially true since the NNA output can be 16 bits. The LSB or low sample part is merely kept to eventually fill empty bits in the high sample part after scaling as described herein.

In order to process these samples more efficiently then, the reshaping layer 602 may perform a deinterleaving operation before further processing. This "deinterleave" operation can be performed by the NNA, and is equivalent to transposing a matrix. The result will be splitting the 32-bit transition samples into two sets of 16-bit sample parts with each high MSB 16-bit sample part H(n) to be placed in a high sample vector 704 and the low LSB 16-bit sample parts L(n) to be placed in a low sample vector 706, as shown on FIG. 7. In other words, a vector 702 of 32-bit input samples, which can be considered as a vector of 16-bit pairs, is reshaped by the deinterleave layer (or transpose operation) into two separate vectors of 16-bit sample part values. Each sample vector then can be placed on its own one or more rows on an input buffer array of the NNA to be processed row by row.

Specifically, a transpose layer operated by the neural network accelerator (such as that mentioned above and shown on FIG. 21 for example) may perform an identity matrix on the MAC entering each sample part from the 32-bit transition sample 614 in the MAC by itself with all other elements being zero to operate an identity matrix. Whenever the identity operation is being used, the weight input to the MAC may be one (1) unless another weight is mentioned. The bias elements are set to zero (0). This way, the output from the MAC will be the same as the input. By one example, the transposition is an available operation realized by a specialized layer for this purpose and operable on the NNA and may use an activation function to perform the transpose. By a different example approach, an output of the MAC can be placed along the same row of similar low or high sample parts thereby transposing the sample array so that all low sample parts are placed together in the same one or more rows of the array and the high sample parts are placed together in the same one or more rows of the array and that are different row(s) than that with the low sample parts. Since processing the deinterleaved input vector in an alternating manner can be considered the same as having each 32-bit transition sample on its own row (with a column of high sample parts separate from a column of low sample parts), this effectively can be considered transposing the input vector 702 into the separate high and low vector rows. With the transpose layer, the accelerator can operate on the sample data row-by-row in row major operation with the low sample parts being analyzed separately than the high sample parts in the next steps of the bit-size conversion operations.

Alternatively, the accelerator could have a data shuffling module that obtains sample data from a memory for placement into the input registers of the MAC of the accelerator. This could retrieve the high sample vector data to have it processed before or after the low sample vector data. Deinterleaving such transpose layer operation and the data shuffling module option are disclosed at least in part by U.S. Patent Publication No. 2018/0121796 cited above It should be noted that while the division of the transition sample may be necessary, the placement of the sample parts into separate high and low sample vectors may be performed by a DSP or other processor rather than a NNA. Note that in this case, the NNA still may generate and/or apply gains described below.

At this point, the high sample parts of the high sample vector 704 are ready for further conversion processing. However, the low sample parts of the low sample vector 706 require more refinement before conversion processing continues on the low sample vector. Thus, process 500 may include "shift low sample part" 512, and this may be performed by unsigned shift layer 604.

Specifically, a shifting operation 720 (FIG. 7A) is shown that is a copy of the shift operation shown on FIG. 6A. The highest bit space of both the low and high sample parts should be reserved for a sign bit to align the computations with the expected sign-magnitude format at least for the bit-size conversion operations (other ASR or KPD operations may use different formats such as two's complement). The sign S on the high sample part 616 is already directly formed at first (or highest) bit space 622 from the initial sample. The low sample part 618 (or 724 on FIG. 7A) still needs to have the sign bit space reserved for the sign S at the first (or highest bit space) 726 (620 on FIG. 6A).

To reserve a bit space 726 for a sign S on the low sample part 618, the transition samples 614 cannot simply be divided into the two 16-bit sample parts since the low sample part only includes the last byte of the 24-bit initial sample in the current example and without a sign. For example, low sample part 722 may be an n-th input in a 16-bit signed container from the 32-bit transition sample and now found in the low sample vector 706. A separated low sample part 724 shows the shifted bits to provide the sign S bit 726. Specifically, the original bit of value $2^{15}$ 728 from the 32 bit container (and the highest bit of the last byte in the original 24-bit sample) cannot occupy bit space $2^{15}$ (726) of the low sample part $x_L$ 722 since bit space 15 (726) is reserved for the sign S bit as shown on FIG. 7A (this is similar to sign S 620 (FIG. 6A)).

Figure 7A:
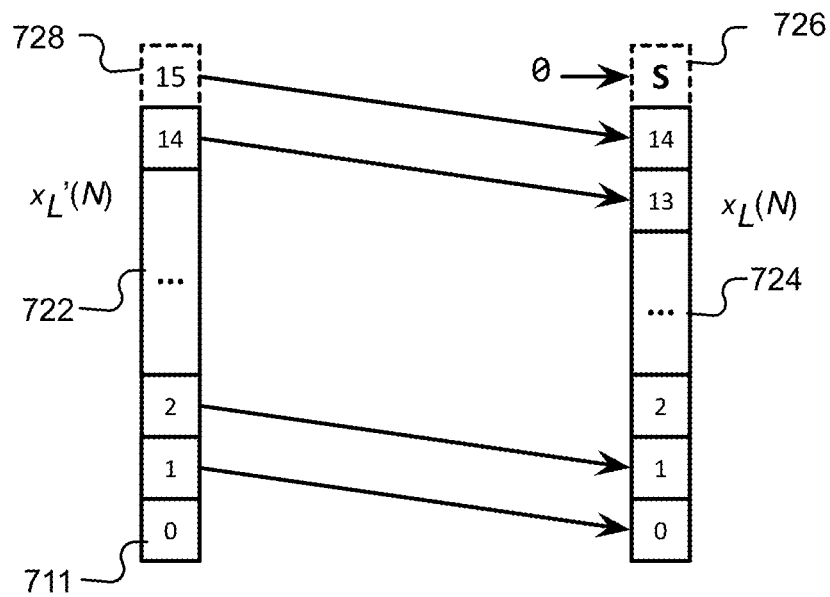
FIG. 7A is a schematic diagram to explain a shift operation according to the sample splitting unit of FIG. 6.

To accomplish the shift, each low 16-bit part is shifted right (or down as shown in FIGS. 6A and 7A) by one bit. This is performed by operating an identity matrix through the MAC so that the output is the same original value as the low sample part which is then fed to an activation function unit of the accelerator (see FIG. 21 for example). A dedicated activation function is then applied to shift the bits down (or to the right) by one bit space of each of the low sample parts as follows.

$$f(x) = \begin{cases} \frac{x}{2} + 2^{14} & \Leftrightarrow x < 0 \\ \frac{x}{2} & \Leftrightarrow x \geq 0 \end{cases} \quad (2)$$

where x is the value of the low 16-bit sample part on the low sample vector and f(x) is the new numerical value of the low sample part not including the sign S value. The double arrow refers to each side of the equation implying the other. The $2^{14}$ is added to create a positive value from any negative value including the maximum negative value possible. Equation (2) results in the sign bit space 15 ($2^{15}$) being initially set at zero (positive or unsigned).

Also in this case, the last bit of each or individual transition samples (the LSB of the 32 bit containers) 611 (or 711) is dropped when shifting the bits to form the low sample parts $x_L$ 724 at the low sample vector 706 to provide sufficient space for 15 bits plus the sign S bit space 726 in the 16-bit low sample part $x_L$ 724. However, no information is lost since 24-bit samples are aligned to the MSB and the LSB bit space in the 32 bit container is empty when holding a 24-bit sample.

After the splitting operation, process 500 may include "determine absolute value of sample parts" 514. The high sample parts $x_H$ are still signed and thus not suitable for gain factor estimation. The gains should be applied to the unsigned sample parts because the sample with maximal absolute value should be found in following steps. All values should be unsigned so they can be compared in Max Pool operation. This operation obtains the absolute value versions of the signed low and high sample parts. A sign vector separate from the sample parts is generated to preserve the sign of the initial sample, and in turn the sample parts, and stored for eventual recombination with scaled versions of the low and high sample parts.

Figure 8:
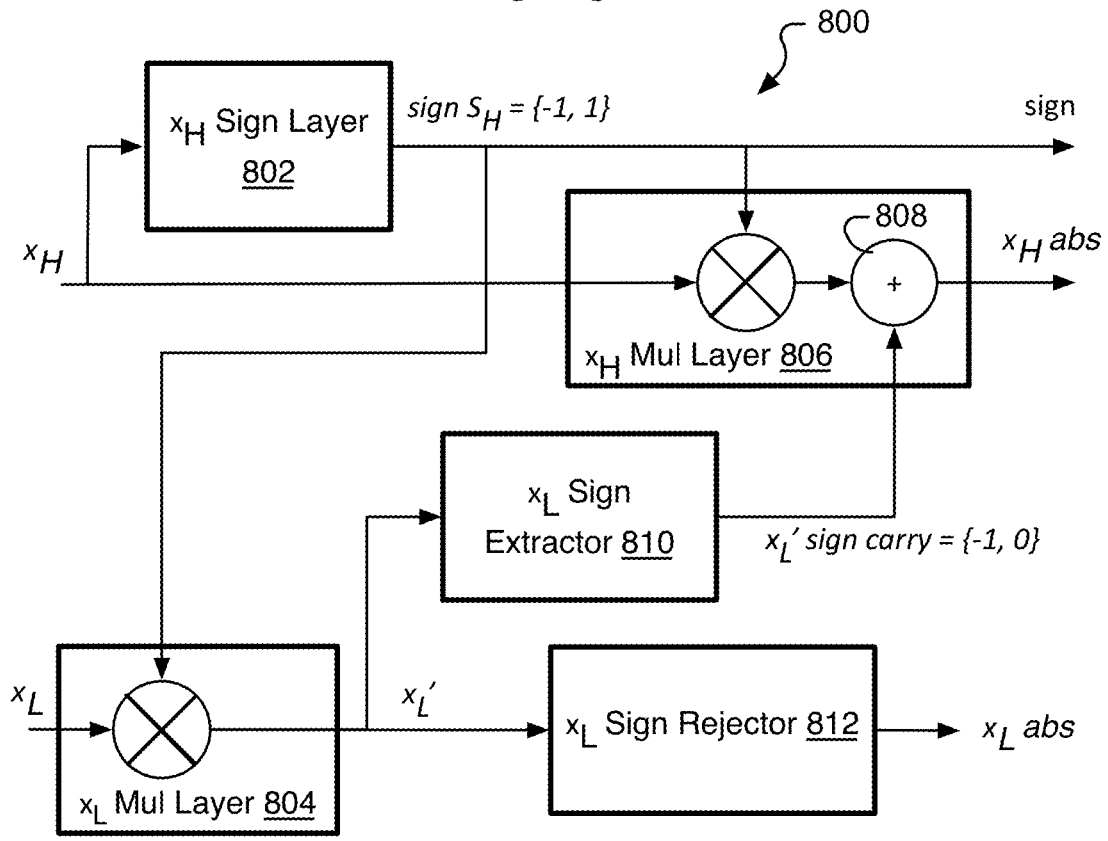
FIG. 8 is a schematic diagram of an example absolute value unit according to at least one of the implementations described herein.

Referring to FIG. 8 to perform these operations, the absolute value unit 304 (FIG. 3) or 800 has an $x_H$ sign layer (or unit) 802, an $x_L$ mul (multiply) layer (or unit) 804, an $x_H$ mul (multiply) layer (or unit) 806 with an adjuster 808, an $x_L$ sign extractor unit 810, and an $x_L$ sign rejector 812. The operation of these layers are explained with the process operations as follows.

Process 500 may include "form high sample part sign vector" 516. After splitting the transition sample, the low sample part $x_L$ is a non-negative number with the sign S of zero at the highest bit space ($2^{15}$). The high sample part $x_H$, however, has a sign bit that is carried over from the initial sample and can be positive (1) or negative (−1) (0 or 1 in binary respectively). The sign value is extracted by $x_H$ sign layer 802 and placed in a sign vector $S_H$, and by one form, with the same bit-size as the desired output sample bit-size. The sign vector is in a sign-magnitude format or two's complement format, but otherwise any format that permits the computations herein.

This involves first using an identity matrix or operation as described above to place the high sample part $x_H$ being analyzed into the input of the MAC of the NNA without any other input elements so that the output of the MAC matches the input sample part value. This permits the NNA to then input the high sample part to an activation function:

$$f(x) = \text{sign}(x) \quad (3)$$

which then reads the highest bit of the high sample part to identify whether the sign is either −1 or 1 (binary 1 or 0 respectively). This value is then placed in its own sign vector, and here in a 16 bit container as mentioned, where the highest bit in the vector is either 0 or 1 respectively in binary) to indicate the sign. All other bit spaces in the sign vector are set to zero except the lowest bit ($2^0$) is set to 1 so that the value of the sign vector $S_H$ is 1 or −1. Other sign formats could be used as well as long as the binary value is 1 or −1. Thus, the specification of the $x_H$ sign layer 802 can be summarized as:

Input: $x_H$ (16 bits)
Activation function: f(x)=sign(x)
$1 \Leftrightarrow x_H \geq 0$
$-1 \Leftrightarrow x_H < 0$
Output: $S_H$=sign of $x_H$ (16 bits)

The absolute value operation 514 then may include "apply sign to low sample part" 518, and this operation involves the $x_L$ mul (multiply) layer 804 multiplying the sign vector by the low sample part $x_L$. This is performed to add the sign to the unsigned low sample part in order to form a sign carry that can be used to adjust the high sample part. This is explained below. Thereafter, the sign is removed from the low sample part to obtain the absolute value of the low sample part for further processing.

The operation here to attach the sign to the low sample part may be performed as simple multiplication between two binary values in two's compliment format in this example. With this operation, the $x_H$ value of the high sample part should be corrected if there are any bits set in the low sample part $x_L$. Note that the resulting sign (for the sign extractor) will only appear in this case when the low sample part $x_L$ is non-zero in the beginning (higher bits). When the higher bits of the low sample part is zero, then the 'carry' branch does not change the values of the sample. Thus, the $x_L$ mul layer 804 may have:

input: low sample part $x_L$ (16 bits)
output: signed low sample part $x_L'$ (16 bits in sign-magnitude format)

This may be accomplished without an activation function and by using the identity function on the NNA again to enter the low sample part $x_L$ as the only input element on the MAC (all other input elements being defaulted to zero) while entering the sign as a weight on the MAC so that the MAC multiplies the sign by the low sample part $x_L$ being analyzed.

Next, the absolute value process 514 may include "determine low sign extractor" 520. This may be used to adjust the high sample part in case the low sample part is non-zero. It generates a low sample part sign carry vector to be added to the high sample part to take into account the sign bit, which is the MSB of the low sample part with a negative sign and in two's complement format. The specification of this $x_L$ sign extractor layer 810 may be:

input: $x_L'$ (signed 16 bits)

activation function: $f(x) = \mathbb{1}(x) - 1$ $0 \Leftrightarrow x_H \geq 0$ $-1 \Leftrightarrow x_H < 0$ output: $x_L'$ sign carry {−1, 0} (in 16 bit signed format) \quad (4)

where $\mathbb{1}$ is the indicator function and x is the signed value of the high sample part. This layer or unit 810 also may be performed by using an identity operation at the MAC to maintain the value of the high sample part and then input the high sample part into the activation function.

Also, the absolute value operation 814 may include "apply sign to high sample part" 522, and "adjust high sample part for non-zero low sample part by applying low sign extractor to signed high sample part" 524. This first multiplies the sign $S_H$ now in sign vector form and by the signed high sample part $x_H$ that the sign originated from. By one form, this operation may be multiplication in two's compliment format so that an inversion algorithm is applied to negate all bits which is then added to one. This multiplies the high sample part value by its own sign to remove the sign and create the absolute value. While an abs(x) activation function could be used, using the sign extractor permits earlier removal of the sign for the subsequent operations that need an unsigned values.

Then, the result of the multiplied vector is adjusted by an adjuster 808 by adding the sign carry from the $x_L$ sign extractor 810. The $x_H$ mul layer 806 may perform these operations and has the following features:

inputs: $x_H$ (16 bits), sign $S_H$ (16 bits), $x_L'$ sign carry (16 bits)

$x_{H\,abs} = (x_H * \text{sign } S_H) + x_L'$ sign carry output: $x_H$ abs (16 bits) \quad (5)

To accomplish these operations by the NNA, the signed high sample part $x_H$ may be entered into the MAC as the input value in an identity operation as described above. The sign $S_H$ may be entered into the MAC as a weight so that it is multiplied by the signed high sample part, and the $x_L'$ carry sign may be entered into the NNA as a neural network bias so that it is added to the result of the multiplication. This can be repeated for each high sample part being analyzed in the high sample vector. The result is the unsigned (or absolute value) high sample part $x_H$ abs with 16-bits.

Figure 9:
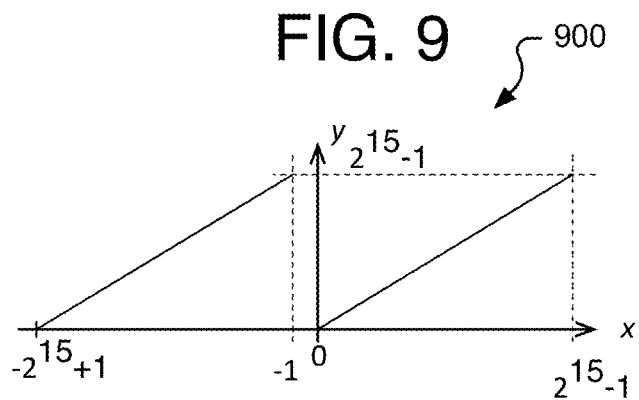
FIG. 9 is a graph of a sawtooth function to explain sign rejection according to the absolute value unit of FIG. 8.

Separately, process 500 may include "generate absolute value low sample part" 526, and this may be accomplished by having the low (or $x_L$) sign rejector 812 remove the sign from the signed low sample part $x_L'$. The features of the layer are as follows:

input: $x_L'$ (16 bits)  (6)

activation function $f(x) =$ $$\text{sawtooth}(x) = f(x) = \begin{cases} x + 2^{15} & \Leftrightarrow x < 0 \\ x & \Leftrightarrow x \geq 0 \end{cases}$$

output: $x_{L\,abs} = x_L'$ with sign bit cleared (16-bits)

where x is the numerical value of the 16-bit signed low sample part. A graph of the sawtooth activation function is shown on FIG. 9. The $2^{15}$ is added to x to convert any possible negative value into a positive value. By this example, the sawtooth(x) equation was determined by property of two's complement format of 16-bit signed integer. The result is a low sample part $x_L$ abs with a 16-bit value and on sign bit.

The functionality of the absolute value unit 814 is presented in Table 1

TABLE 1

Calculation algorithm of Absolute Value Unit

| Input | | Output | | |
|---|---|---|---|---|
| $x_H$ | $x_L$ | $x_{H\,abs}$ | $x_{L\,abs}$ | sign |
| ≥0 | — | $x_H$ | $x_L$ | 1 |
| <0 | =0 | $-x_H$ | 0 | −1 |
| <0 | ≠0 | $-x_H - 1$ | $-x_L$ | −1 | where output, composed of higher and lower part, is absolute value of input, also composed of two parts, given input is in two's complement format.

In the next operation, process 500 may include "compute gain for sample parts" 528, and as mentioned above in order to find gains (or weights or scale factors) so that a maximal amount of bits is set in the resulting scaled output sample, and by one approach, so that the highest most significant bit in the high sample parts among all samples in a group or set N of samples is not clipped.

This operation 528 may include "determine maximum high sample part value of sample set" 530. The gains that are to be applied to the absolute value sample parts are based on the maximum sample part value among all samples N being analyzed as a group such as N=416 by the example herein. As mentioned, the sample groups or sets may be formed consecutively so that the groups do not overlap along an audio signal. Alternatively, the groups could be overlapped so that each time a sample is added (or a certain number of samples are added) to the group or set, the same number of samples are removed in FIFO order by one example, and the new group is reanalyzed by the ASR or KPD.

In order to determine the maximum sample part value in the group, and specifically from the high sample parts (and in turn, from the high sample part vector 704 for example), the max pooling unit 306 operates a pooling layer such as that would be used in a convolutional neural network (CNN). By one example form, such as with the GNA cited above, the largest available pooling factor is six, so four consecutive layers are necessary to determine the maximal high sample part value from N=416 elements. The configuration of such maxing layers is presented in Table 2.

TABLE 2

Example Max Pooling Layer Structure

| Layer | Input elements | Input stride | FIRs in use | Out pool size | Outputs | Actual reduction factor |
|---|---|---|---|---|---|---|
| 1 | 416 | 8 | 8 | 6 | 9 × 8 (72) | 5.8 |
| 2 | 72 | 8 | 8 | 6 | 2 × 8 (16) | 4.5 |
| 3 | 16 | 4 | 4 | 6 | 1 × 4 (4) | 4 |
| 4 | 4 | 1 | 1 | 4 | 1 × 1 (1) | 4 | where FIR is finite impulse response filters used.

Figure 11:
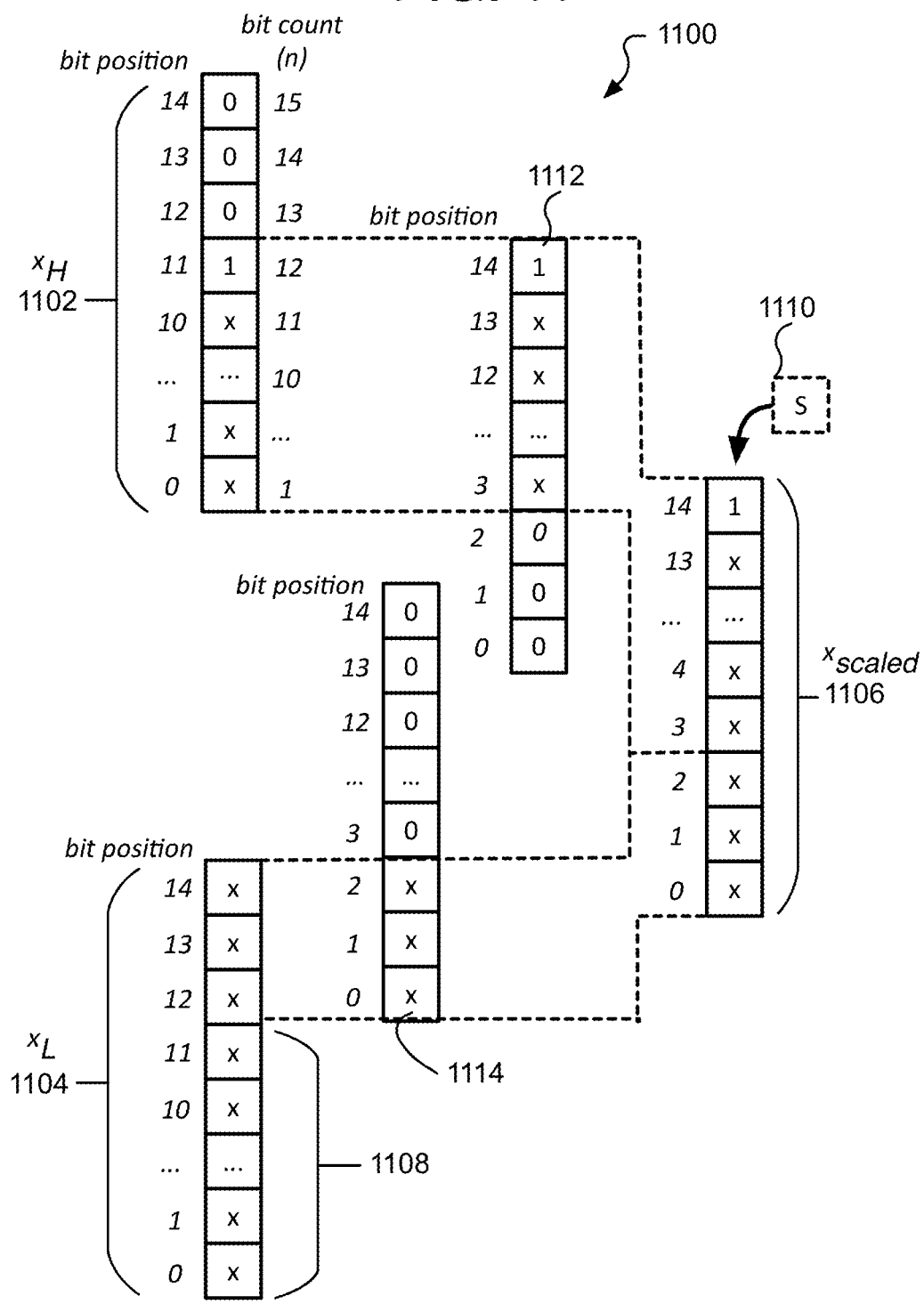
FIG. 11 is a schematic diagram to demonstrate the merging of sample vectors to form a single scaled sample vector by the scaling unit of FIG. 10.

Next, process 500 may include "compute low gain" 532 and "compute high gain" 534. This may be performed by gain estimator unit 308, and for the reasons mentioned above. The gains may be computed as follows:

For the range: $x_H \geq 2^{(n-1)}$ and $x_H \leq 2^n - 1$:

$$k_H = 2^{(15-n)} \quad (7)$$

$$k_L = 2^{-n} \quad (8)$$

where $x_H$ is the value of the maximum high sample part determined from the max pooling described above, and n is the highest (or greatest) bit space as a count of bit spaces in the sample part rather than the bit space number. For example, n=0 occurs when no bit spaces in the sample part have a bit (all are zero), while n=1 refers to the bit space $2^0$ having the only (really highest) bit in the sample part. For a 16-bit sample part with the $2^{15}$ bit space still reserved for a sign S (held as an unsigned or positive zero by the absolute value operation above), the largest n value (n=15) refers to the bit space $2^{14}$. The count for n also is shown on high sample part 1102 (FIG. 11). The range mentioned above merely states the smallest and largest possible values for $x_H$ given n. These values are shown on Table 3 below as well. The high gain $k_H$ is to be applied to the high sample parts and low gain $k_L$ is to be applied to the low sample parts.

In the most extreme cases, such as with the greatest possible value for n (where n=15) and regardless of whether or not the rest of the bit spaces hold a bit, the gain is as follows:

$$x_H \geq 2^{14}$$

$$k_H = 1 = 2^0$$

$$k_L = 2^{-15} \approx 0.$$

On the other hand, when no bits exist (where n=0) in $x_H$, this indicates that no bits exist for any high sample part in the set of all samples $N \Leftrightarrow x_H = 0$. Then:

$$k_H = 2^{15} = 32768$$

$$k_L = 2^0 = 1$$

Note that the $k_H$ value would be too large to fit in the high sample part (it would need the bit space $2^{15}$ which is reserved for a sign as mentioned above). However, it does not matter since the high sample part will drop out in this case. Specifically, when n=0, this will result in the unmodified low sample part forming the magnitude of the output sample. It does not matter, in this case, that the high gain $k_H$ is a large value since the gain $k_H$ is multiplied by the magnitude of the high sample part which is zero. The distribution of the variables for the gain computation including these most extreme conditions are shown on Table 3 below.

TABLE 3

Values of n, K, $k_H$ and $k_L$ for given $x_H$

| n | $x_H \geq 2^{(n-1)}$ | | $x_H \leq 2^n - 1$ | | $k_H$ | | $k_L$ | | K |
|---|---|---|---|---|---|---|---|---|---|
| 0 | 0 | N/A | 0 | N/A | 0 | | 1 | $2^0$ | 7 |
| 1 | 1 | $2^0$ | 1 | $2^1 - 1$ | 16384 | $2^{14}$ | 1/2 | $2^{-1}$ | 6 |
| 2 | 2 | $2^1$ | 3 | $2^2 - 1$ | 8192 | $2^{13}$ | 1/4 | $2^{-2}$ | 5 |
| 3 | 4 | $2^2$ | 7 | $2^3 - 1$ | 4096 | $2^{12}$ | 1/8 | $2^{-3}$ | 4 |
| 4 | 8 | $2^3$ | 15 | $2^4 - 1$ | 2048 | $2^{11}$ | 1/16 | $2^{-4}$ | 3 |
| 5 | 16 | $2^4$ | 31 | $2^5 - 1$ | 1024 | $2^{10}$ | 1/32 | $2^{-5}$ | 2 |
| 6 | 32 | $2^5$ | 63 | $2^6 - 1$ | 512 | $2^9$ | 1/64 | $2^{-6}$ | 1 |
| 7 | 64 | $2^6$ | 127 | $2^7 - 1$ | 256 | $2^8$ | 1/128 | $2^{-7}$ | 0 |
| 8 | 128 | $2^7$ | 255 | $2^8 - 1$ | 128 | $2^7$ | 1/256 | $2^{-8}$ | -1 |
| 9 | 256 | $2^8$ | 511 | $2^9 - 1$ | 64 | $2^6$ | 1/512 | $2^{-9}$ | -2 |
| 10 | 512 | $2^9$ | 1023 | $2^{10} - 1$ | 32 | $2^5$ | 1/1024 | $2^{-10}$ | -3 |
| 11 | 1024 | $2^{10}$ | 2047 | $2^{11} - 1$ | 16 | $2^4$ | 1/2048 | $2^{-11}$ | -4 |
| 12 | 2048 | $2^{11}$ | 4095 | $2^{12} - 1$ | 8 | $2^3$ | 1/4096 | $2^{-12}$ | -5 |
| 13 | 4096 | $2^{12}$ | 8191 | $2^{13} - 1$ | 4 | $2^2$ | 1/8192 | $2^{-13}$ | -6 |
| 14 | 8192 | $2^{13}$ | 16383 | $2^{14} - 1$ | 2 | $2^1$ | 1/16384 | $2^{-14}$ | -7 |
| 15 | 16384 | $2^{14}$ | 32767 | $2^{15} - 1$ | 1 | $2^0$ | 0 | N/A | -8 |

Referring again to FIG. 11 as another example, say the high sample part 1102 has n=12, then applying the equations from above:

$$x_H \geq 2^{11} (2048) \text{ and } x_H \leq (2^{12}-1)(4095)$$

$$k_H = 23 = 8$$

$$k_L = 2-12 = 1/4096$$

This example will be continued below to explain the scaling process 1100 and 536.

To perform the gain computation, the NNA may use AFFINE layers and with a non-linear activation function as stated above in equations (7) and (8) to calculate $k_H$ and $k_L$. Specifically, the identity operation as described above may be used at the MAC of the NNA and an activation function unit (FIG. 21) then may perform the equations (7) and (8) above.

These gains will then be applied to all sample parts in the current set or group with N samples that provided the maximum high sample part to form 'n' in the first place.

The K variable on Table 3 is used to form an adjustment or gain removal coefficient $k_A$ to reverse or remove the gain or offset formed by applying the gains $k_H$ and $k_L$. The adjuster $k_A$ may be applied after further audio processing, such as feature extraction, as explained below.

Figure 10:
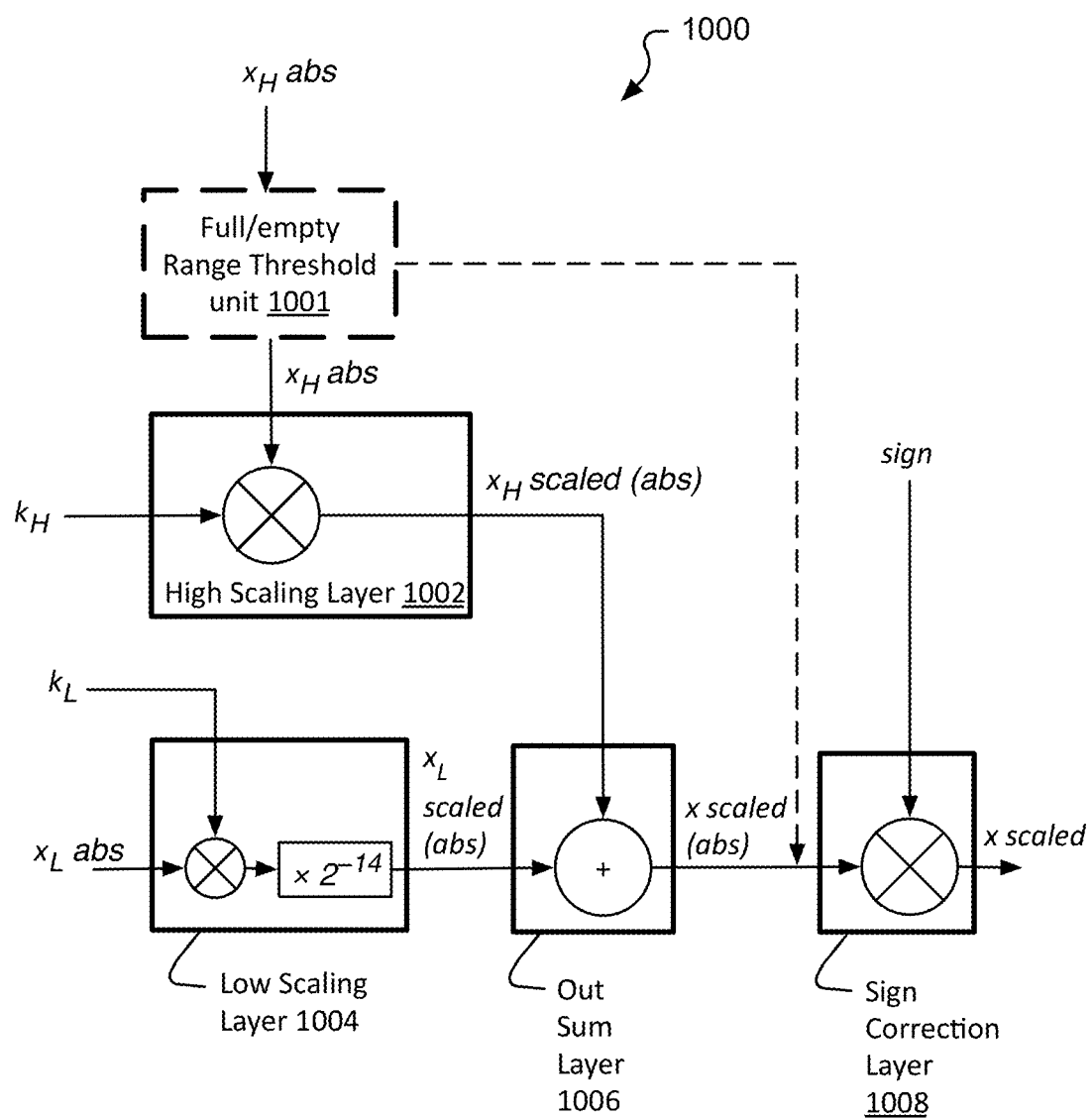
FIG. 10 is a schematic diagram of an example scaling unit according to at least one of the implementations described herein.

Referring now to FIG. 10, process 500 may include "scale sample parts" 536, and this refers to applying the high and low gains to the respective high and low sample parts, and by one form the absolute value versions of the low and high sample parts, to generate scaled high and low sample part. The scaled high and low sample parts then can be combined while re-establishing the sign for the combined sample to generate a scaled output sample. This may be performed by a scaling unit 1000, which may be a form of scaling unit 310 (FIG. 3). The scaling unit 1000 may have a full/empty range threshold unit 1001, a high scaling layer (or unit) 1002, a low scaling layer (or unit) 1004, an out sum layer (or unit) 1006, and a sign correction layer (or unit) 1008. The operation of these units are described with process 500 as follows.

As an optional preliminary scaling operation, process 500 may include the inquiry "full/empty high sample part?" 538, and this inquiry may include having the full/empty range threshold unit 1001 omit the gain application and combining of scaled sample parts when the high sample part already uses the highest bit space available for the magnitude of the high sample part (referred to as full herein) or all of the bit spaces are zero (referred to as empty). Specifically, at this point, both the high sample part $x_H$ and low sample part $x_L$ are non-negative values encoded as signed U2 (the sign bit is cleared where bit space $2^{15}$ is set at zero). When the full range is used in any of the high sample parts (or higher words) in group of N samples such that a bit already exists at the bit space $2^{14}$, then this high sample part may be moved directly to the sign correction unit 1008 to add the sign to the high sample part (at operation 552) and to use the magnitude of this full high sample part directly as the output sample. This is done without performing scaling computations, which increases performance. By one form, it is not checked whether all bits of the input 24-bit sample part are set in such a case because of a dynamic limitation of the 16-bit processing system. In other words, it is mainly concerned with the high sample part at first.

Likewise, in the boundary or extreme case when a high sample part $x_H$ being analyzed equals zero (and therefore is empty), then the low sample part $x_L$ may be provided (or copied) directly to the sign correction unit 1008 to add the sign and provide it as the output sample without performing gain or scaling operations.

Alternatively, the gain and scaling application could be applied to these full or empty sample parts anyway, but it will be understood that the results will be the same or similar to the results that can be obtained by skipping these operations because the gain and scaling equations provide these results.

Otherwise, When the high sample part is only partially filled, or when the full/empty condition of the high sample part is not checked, then the scaling unit 310 applies the gains to the sample parts and combines them according to the following formula:

$$X_{scaled} = (k_H \cdot X_H) + (k_L \cdot x_L \cdot 2^{-14}) \quad (9)$$

where the '·' refers to simple scalar multiplication between two binary values (rather than any vector computation such as dot product, etc.). Likewise, the addition simply may be addition of two binary values of scaled high and low sample parts $x_H$ and $x_L$.

Applying equation (9), the example of FIG. 11 with n=12 may continue with:

$$x_{scaled} = k_H \cdot x_H + k_L \cdot x_L = 2^3 \cdot x_H + 2^{-12} \cdot x_L.$$

Process 500 may include "apply gain to sample parts" 540, and this may include "modify high sample part by high gain" 542. This operation may be performed by the high scaling layer 1002 by one example and results in increasing the value of the high sample part as described above. In the scaling example or operation 1100, a high sample part $x_H$ 1102 and a low sample part $x_L$ 1104 were obtained from an initial sample as described above. The sample parts are absolute value sample parts and the zeroed sign bit space $2^{15}$ is not shown on the sample parts. For this operation, a high gain is applied to the high sample part $x_H$ 1102 by multiplying the gain by the value of the high sample part. This generates a scaled high sample part $x_H$ scaled (abs) 1112 where the gain caused a bit shift so that the MSB of the high sample part 1102 now occupies the largest bit space $2^{14}$. The remainder of the bits from the high sample part 1102 are filled in order behind the largest bit space until the last bit spaces of the scaled high sample part are left empty (at zeros). In the continuing example where n=12, the scaled high sample part has three empty bits $2^2$ to $2^0$ that subsequently can be filled with bits form a scaled low sample part 1114 upon the summation of the scaled high and low sample parts. This operation drops the remaining rejected bits 1108 from the low sample part 1104.

Particularly, process 500 may include "modify low sample part by low gain" 544, and this may be performed by the low scaling layer 1004. Here the multiplication of the low gain and low sample part 1104 proceeds as with the high sample part.

To perform the application of the gains on the NNA, the input scaling factors or gains ($k_L$ and $k_H$) are used as weight vectors in diagonal affine layers where a diagonal matrix is used as the weight matrix. In the diagonal matrix layer, the weight values that do not occupy a space on the main diagonal of the matrix are all zeros. Thus, the operation is reduced to a matrix being an array with one element for each point in the diagonal. For the use of the diagonal matrix layer, the input and output arrays should have the same size.

Regarding the low sample part still, applying the gain results in either maintaining the same low sample part value or reducing the value of the low sample part. However, at this point, the low sample part still is not aligned to fill empty bits on the scaled high sample part because the gain-modified low sample part is still off by 14 bits since the low sample part $x_L$ may be fractional (due to a fractional gain value) and changes in the range of $<2^{-14}, 1>$. Thus, process 500 may next include "scale low sample part" 546, and the gain-modified low sample part is multiplied by $2^{-14}$. By one approach, this uses a division operation that may be performed by the activation function of the low scaling layer 1004 and on the gain-modified low sample part received directly from the MAC. The result is a scaled low sample part 1114 that is now ready to fill the empty bit spaces in the scaled high sample part.

Process 500 may include "combine sample parts" 548, and this includes "sum high and low sample parts" 550, which may be performed by the out sum layer 1006. Thus, after the separate scaling, both higher and lower part are summed into a single scaled output sample $x_{scaled\ (abs)}$ 1106 by the out sum layer 1006. This operation places the highest bits of the low sample part, and in turn the now aligned bits of the scaled low sample part 1114, into the lower spaces of the scaled output sample 1106. This is straight addition of two binary values and may be performed on the NNA by entering both values in the MAC with all others being zero. The resulting scaled output sample still is an absolute value that has its highest bit reserved at zero to be filled with a sign.

Process 500 may include "correct summed parts for sign to generate signed scaled output sample" 552, which may be performed by the sign correction layer 1008. Here, the sign vector, extracted earlier by the absolute value unit 800, is either 1 or −1 and it is applied to final samples in the sign correction layer 1008. The application of the sign is performed by an affine diagonal layer, where a vector of absolute values is placed on the input, and the sign acts as weights on the diagonal layer. This involves element-by-element multiplication. The effect is a signed output sample 1106 with the MSB sign bit 1110 placed back onto the sample to form a scaled and signed output sample in two's complement, sign-magnitude, or other sign format.

It should be noted, as an alternative, that the gain could be generated and applied to only one of the sample parts, such as the high sample parts. This may be an improvement for higher signals, and the inverse may be true. Also, more than two sample parts could be generated from an initial sample and then recombined as described herein for two sample parts.

It will be appreciated that the system could be modified to handle a different certain number of used bits. The system does not always need to use all bits up to the highest bit. For example, some systems saturate on signals that are too high, and the present system can be used to limit the signal level. This can be achieved by using other activation functions that compute adjustment coefficients $k_X$ and $k_L$ for example.

For audio processing that is not related to ASR or KPD, the scaled and signed output samples may be received by an application for further audio processing. For ASR or KPD, the processing may continue with feature extraction.

Process 500 may include "generate feature vector from feature extraction" 554. The features are extracted by the feature extractor unit 312 for example. This may include calculating the energy spectrum and applying a logarithmic function on the resulting sums as described above. Therefore, this operation is proportional to ~$\log(x^2)$. This can be used to form an adjustment $k_a$ as follows.

Process 500 may include "remove gain from feature vectors" 556, and this may include "compute gain adjustment $k_a$" 558. This also may include removing at least part of the gain rather than the entire gain when relevant. The scaled output samples should be used during feature extraction but then removed for following audio processes in ASR and KPD because, as mentioned above, additional change of signal level would interfere with algorithms that do not expect it. For example, signal recorded from far distances, therefore low level signals, would be amplified, which results in the lose of information about the original distance. The use of samples in this way has the benefit of being compatible with a desirable dynamic range of inputs handled by different feature extraction algorithms. This can be performed by the gain adjustment unit 316. Specifically, the gains introduced in the scaling operation can be effectively removed by summing the scaled feature vector that is output from the feature extractor unit with an adjustment factor $k_A$. This value may be generated by the gain estimator unit itself or by a separate gain adjustment unit. The adjustment factor $k_A$ should compensate for, or reverse, the gains $k_H$ and $k_L$ and remove the increase in value (or offset) of the scaled feature vector that is due to the gains. Thus, in order to correct for the gain introduced, the factor $k_A$ should be equal to:

$$k_A(K) = -2^Q \log(2^K) = -2 \cdot K \cdot \log 2 \qquad (10)$$

where K is an offset generated by the multiplication of $k_H$ and $k_L$ with their respective sample parts and with K values as recited on Table 3 above as one example, and Q is a q-factor of fixed-point representation of values in the feature vector generated by the feature extraction unit. Otherwise, $k_A$ may be generated by adjusting the K constant to obtain samples in optimal level for following ASR or KPD algorithms.

Process 500 may include "use $k_a$ to adjust feature vector" 560, and as mentioned, this may be a summation between the adjustment $k_A$ and the feature vector. By one form, this is simple addition between two binary values. On the NNA, this may be performed by using an identity operation and adding the adjustment value $k_A$ as a bias in the NNA.

Process 500 may include "provide de-scaled feature vectors to audio processing units" 562, and where the de-scaled feature vectors may be provided to other ASR or KPD audio processing units, or to other audio processing units or applications that perform other audio processing operations.

With the implementation of the neural network operations described above, an all-neural network keyphrase process can be implemented eliminating or significantly reducing the use of a DSP or other general-purpose processors. This may include operations for bit-size conversion, feature extraction, acoustic scoring, and keyphrase decoding. Similar NNA operation may be perform with large vocabulary ASR as well as other audio processing applications.

Figure 21:
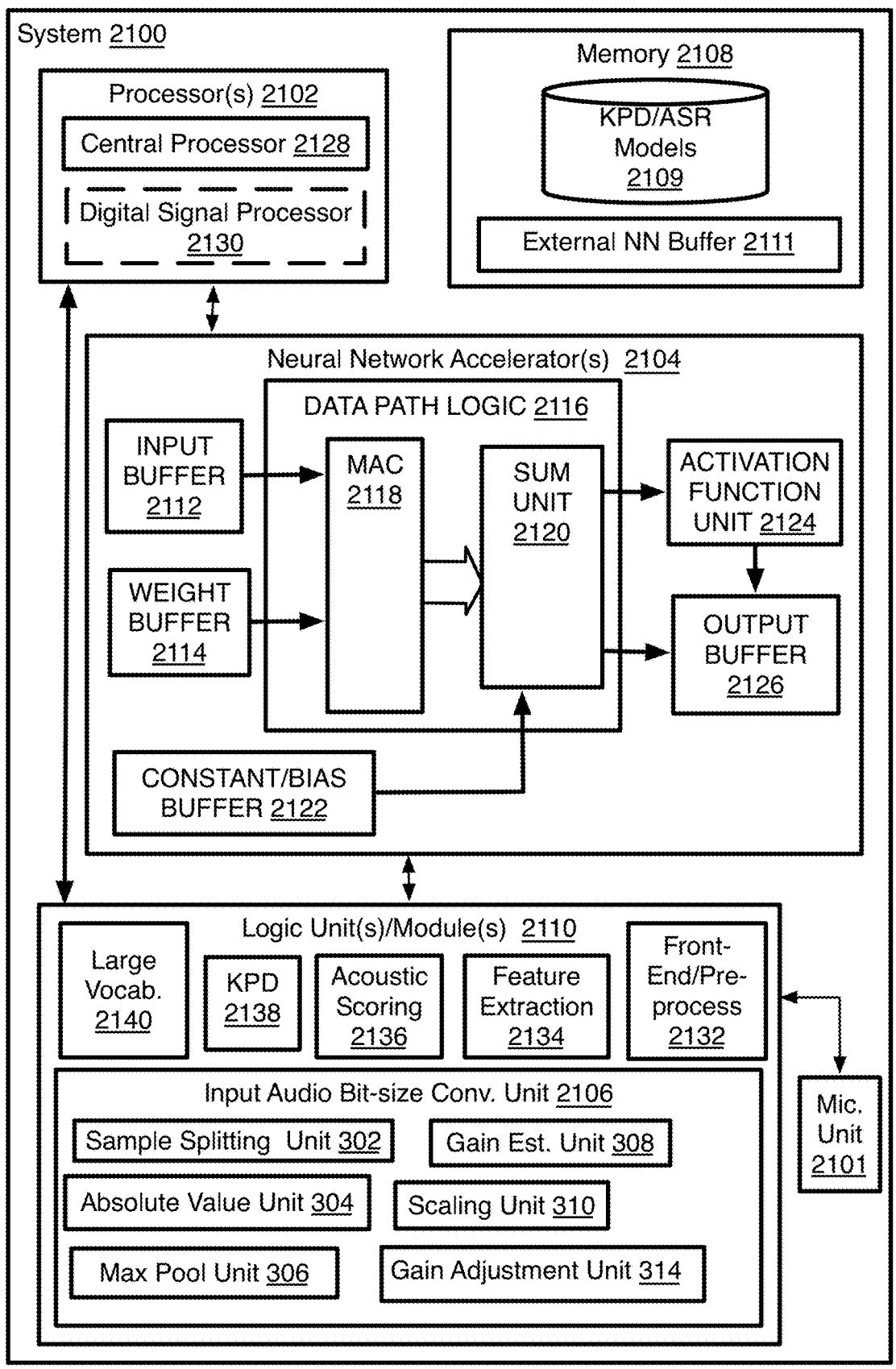
FIG. 21 is an illustrative diagram of an example system.

Referring to FIG. 21, an example audio processing system 2100 may perform process 400 or 500. System 2100 may perform keyphrase detection or ASR as arranged in accordance with at least one of the implementations of the present disclosure. System 2100 may include one or more neural network accelerators 2104 as well as other processor(s) 2102 such as a central processor 2128 and optionally a digital signal processor 2130, a memory 2108, and microphone 2101. The system 2100 also may include logic unit(s) or module(s) 2110 including a front end/pre-processing unit 2132, an input audio bit-size conversion unit 2106, similar to bit-size conversion unit 300, feature extraction unit 2134, acoustic scoring unit 2136, KPD unit 2138 which may include a keyphrase detection decoder, and a large vocabulary unit 2140 which may include a decoder for ASR as well, and any of which may be implemented by the NNA 2104 as described herein. In some implementations, the input audio bit-size conversion unit 2106 may include the sample splitting unit 302, absolute value unit 304, max pool unit 306, gain est. unit 308, scaling unit 310, and gain adjustment unit 314, any or all of which may be operated by the NNA 2104 as described herein.

Memory 2108 may store KPD/ASR models 2109 as well as external neural network (NN) buffer 2111, which may store any of the data mentioned herein and otherwise data used by the NNA 2104 and before or after storage of the data in buffers on the NNA 2104 itself.

The NNA 2104, which may be at least one NNA, may have specific-purpose dedicated hardware to implement the neural network operations described herein, and may include an input buffer 2112 to hold audio data (such as sample parts in the form of vectors or matrices filling an input buffer array) for a specific layer being processed, a weight buffer 2114 to hold values that are being treated as weights applied to the input data as described above, and often in the form of a weight vector or matrix. It will be understood that these local buffers may be physically located on a board or chip with the other processing components of the NNA or could be physically external to the NNA such as at the external NN buffer 2111. The NNA 2104 also may have data path logic 2116 that has a multiply-accumulate circuit (MAC) 2118 that performs highly parallel operations (such as multiplication and sums as mentioned above) to propagate the input data, a sum unit 2120 that sums together intermediate summed values or values that are being input to the NNA as bias values for example, a constant/bias buffer 2122 that holds values to be treated as bias values to be provided to the sum unit 2120, an activation function unit 2124 that performs any other operations of an activation function unit not already performed at data path logic 2116 and as described above, and an output buffer 2126. It will be appreciated that NNA 2104 may have many other components (units, modules, logic, buffers, and so forth) to perform the neural network operations whether hardware, software, or a combination of both. Such other NNA components that may be included in example NNA 2104, and a more detailed description of the NNA, is disclosed by U.S. Patent Publication No.: 2018/0121796 cited above.

By one form, a different activation function unit 2124 may be provided for individual or each activation equation described above sharing the same MAC on an NNA 2104. By other forms, a different NNA 2104 may be provided to handle different activation functions or different types of activation functions. By yet another form, a single NNA 2110 is used and has an adaptable activation function unit 2120 where the equation to be operated may be loaded into the activation function. Alternatively, multiple operations 2116 may share a common activation function 2124.

Otherwise, central processor 2128 and digital signal processor 2130, when provided, may include any number and type of processing units that may provide the operations as discussed herein, if provided at all. Such operations may be implemented via software or hardware or a combination thereof. For example, digital signal processor 2130 may include circuitry dedicated to manipulating data obtained from memory 2108 or dedicated memory. Furthermore, central processor 2128 may include any number and type of processing units or modules that may provide control and other high level functions for system 2100 as well as the operations as discussed herein. As mentioned by one example, a DSP may only perform hardware initiation and interrupt handling for a start-to-end neural network processing of KPD or ASR including the bit-size conversion disclosed herein.

Memory 2108 may be any type of memory such as volatile memory (e.g., Static Random Access Memory (SRAM), Dynamic Random Access Memory (DRAM), etc.) or non-volatile memory (e.g., flash memory, etc.), and so forth. In a non-limiting example, memory 2108 may be implemented by cache memory. In an implementation, at least NNA 2104 and memory 2108 may be implemented as a system on a chip.

It will be understood that while an affine layer is described as the layer used to perform the operations herein on an NNA, these layers are chosen for their simplicity and accuracy. Thus, other types of neural network layers could be used as long the operations can be performed by using a neural network, and by one implementation, can be performed on a neural network accelerator or other hardware circuit or logic that is arranged for the specific purpose of operating one or more neural networks.

It also will be understood that other end-applications can benefit from the neural network operated bit-size conversion as described above, and is not necessarily limited to ASR and KPD.

Experimental Results

A proposed system of feature extraction using the disclosed bit-size conversion process was compared to a reference system, and the results are provided as follows. Both systems convert 24-bit audio input samples into 16-bit samples and feeds the 16-bit samples to a front-end module which performs feature extraction using 40 FIR filters.

Figure 12:
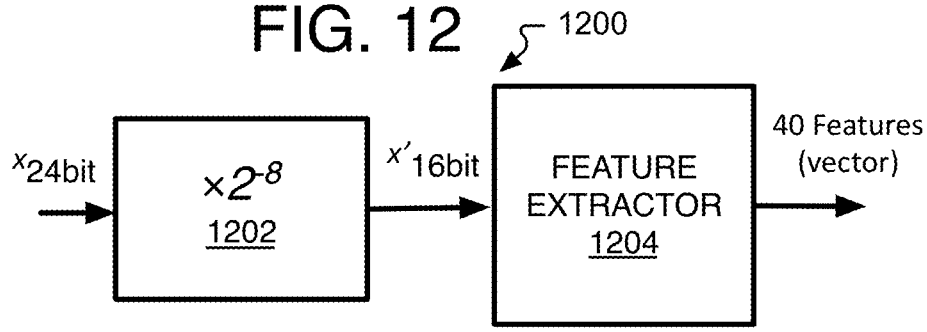
FIG. 12 is a schematic diagram of a control conventional sample bit-size conversion system used for comparison in experimentations.

Referring to FIG. 12, a control or reference sample bit-size conversion system 1200 used for the comparison has a conversion unit 1202 that receives 24-bit sample input and performs fixed truncation of the 24-bit samples to 16-bit input by applying a $2^{-8}$ bit shift that performs a right shift by eight bits to discard the eight lower bits. The resulting 16-bit samples now missing the less significant byte from the initial sample is provided to a feature extractor 1204. Thus, the reference system performs 24-bit to 16-bit depth conversion in a fixed manner.

Figure 13:
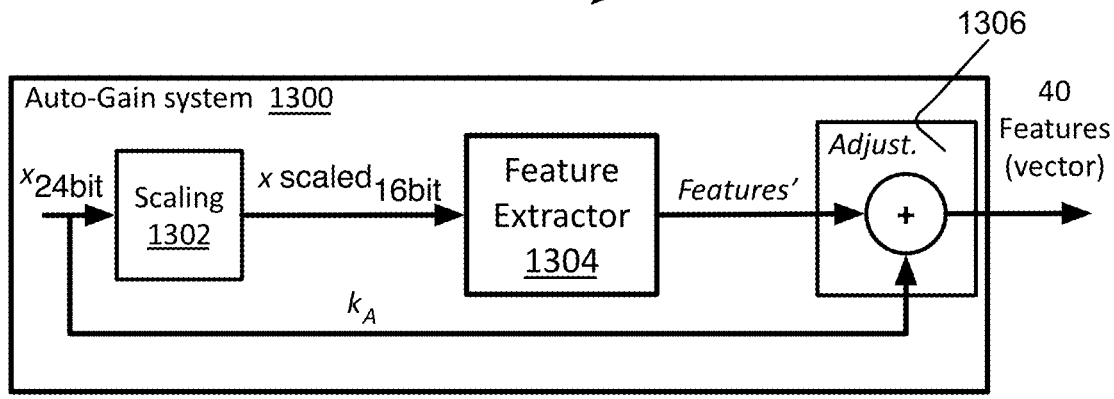
FIG. 13 is a schematic diagram of a sample bit-size conversion system according to at least one of the implementations disclosed herein.

Referring to FIG. 13, an example bit-size conversion system 1300 (here titled as an auto-gain system) for comparison and according to at least one of the implementations disclosed herein has a scaling or bit-size conversion unit 1302 that performs the operations of the conversion unit 300 described above, a feature extractor 1304, and an adjustment unit 1306 that applies a gain adjustment also as described above to cancel at least part of the gain introduced by the conversion unit 1302. The bit-size conversion system 1300 was implemented on a GNA All-Neural accelerator as described above.

Figure 14A:
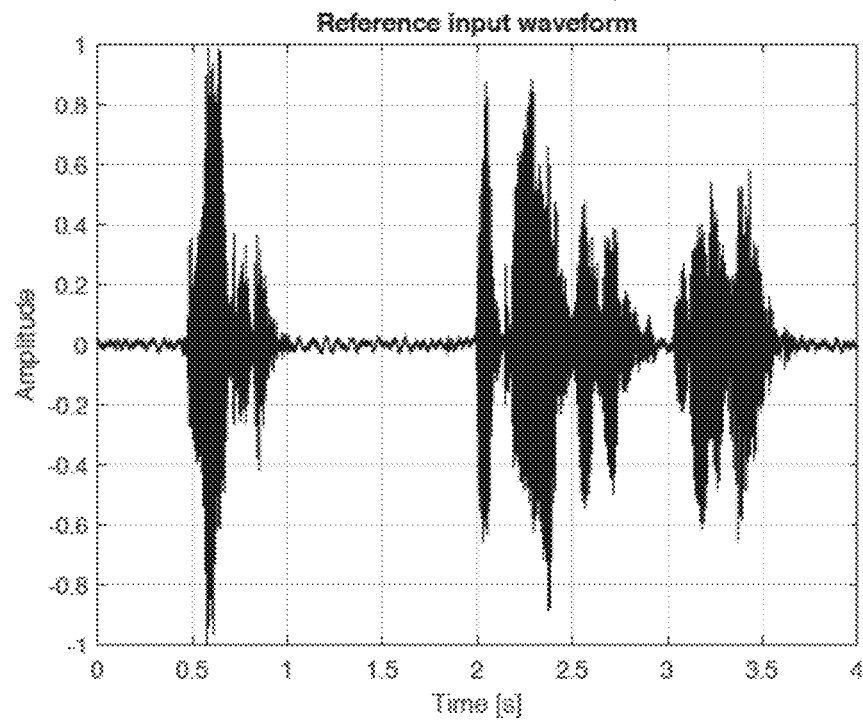
FIG. 14A is a graph showing a reference input waveform of audio input.

The input signal used in the experiment was a key-phrase with command: "Alexa, what time is it in Las Vegas, Nevada?" uttered by a woman. Both near and far-field scenarios were included in order to evaluate the solution using a wide dynamic range of the signal level. The input waveform or signal dynamics of the input phrase used for testing is shown on a graph 1400 (FIG. 14A). The signal for the far-field scenario was simulated.

Figure 14B:
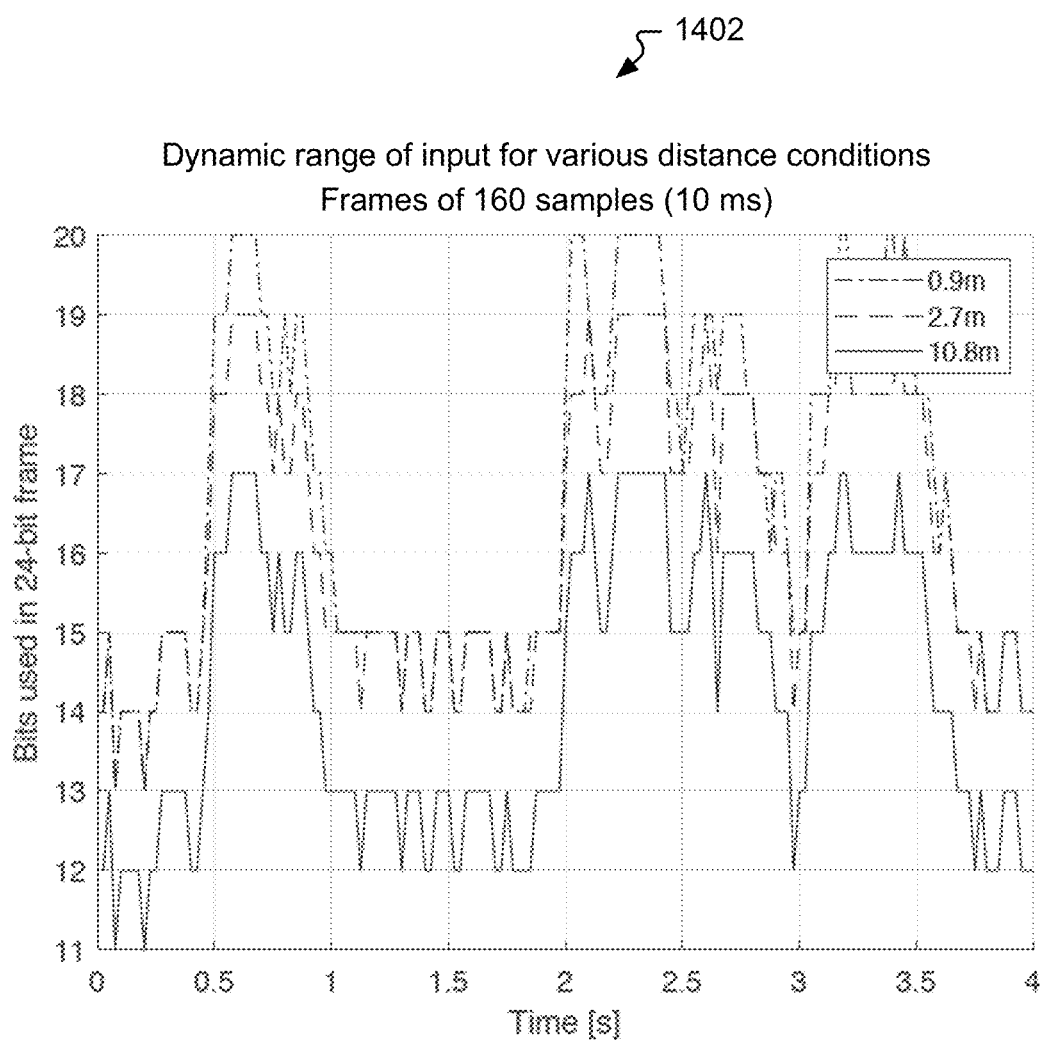
FIG. 14B is a graph showing the number of bits occupied for each 24 bit input sample of the audio input tested.

Referring to FIG. 14B, a graph 1402 shows the number of bits occupied for each 24 bit input frame of the audio input tested. Sample with max magnitude was taken for each frame. The levels of a simulated signal are provided for various distances, expressed as bits occupied by samples in time, and for a sequence of 160 frames (or 10 ms for each sample). In this case, this includes 0.9 m, 2.7 m divided by three, and 10.8 m divided by twelve, where the division (suppression) refers to simulation of larger distance.

The front-end or feature extractor 1304 transforms input audio samples to frequency representation. It calculates 40-dimensional feature. vectors where the features correspond to the power level in consecutive bands and a spectrum covering the human audible range. Two feature outputs were selected here, one from a lower spectrum part (FIR #5) and one from a middle of the spectrum (FIR #20). Lower energy in a higher band is expected because the power spectrum of speech decreases with higher frequencies.

Figure 15A:
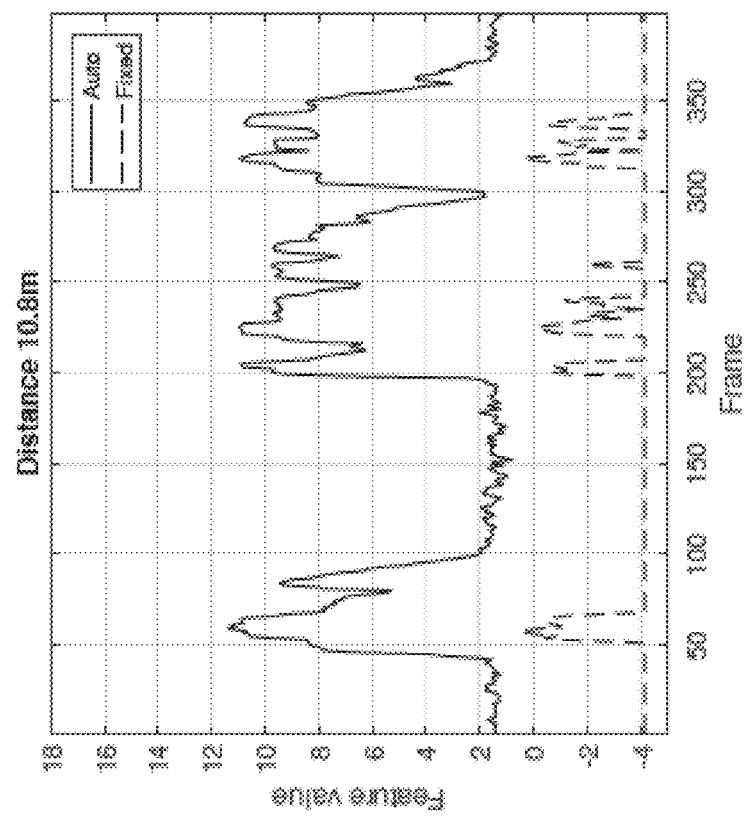
FIGS. 15A-15B is a graph in the frequency domain showing a comparison of feature values between that of the disclosed method and the reference fixed gain system at a low spectrum part and for various distances.
Figure 15B:
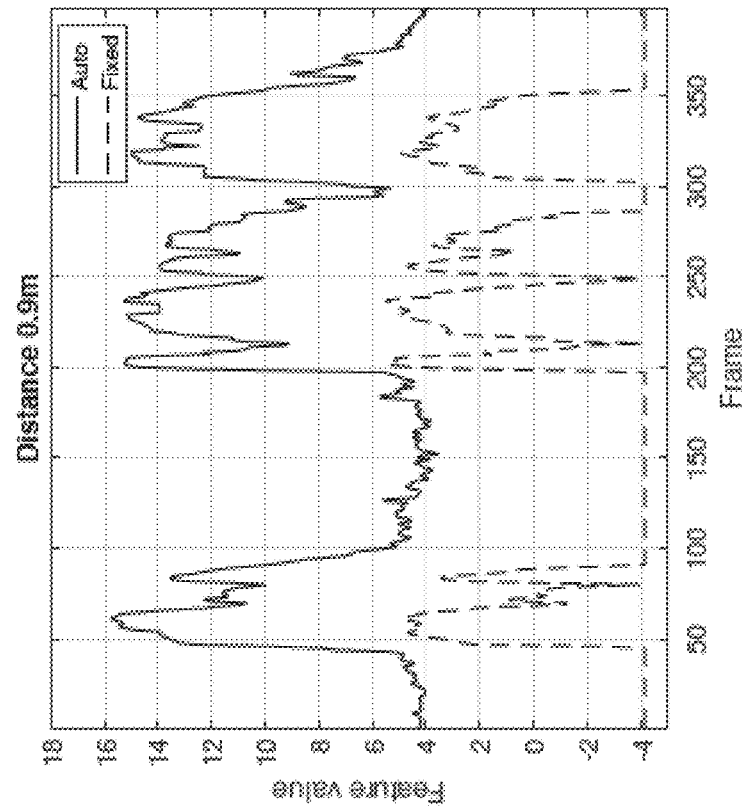

Referring to FIGS. 15A-15B, graphs 1500 and 1502 are in the frequency domain to show a comparison of feature values between that of the disclosed method (solid line) and the reference fixed gain system (dashed lines) at a low spectrum part (feature #5 (FIR 5)) and for various distances 0.9 m and 10.8 m. The feature values of the present system are much higher than that of the conventional fixed system. The output signals of the reference fixed gain system (or conventional fixed system without automatic adjustment) have significantly lower levels here. There are periods between words where the signal stays constant on a low value (e.g. between the $100^{th}$ and $200^{th}$ sample). Such condition is not desired because it carries no information about an audio environment. In comparison, when the disclosed sample bit-size conversion is used with auto-gain generation, significant information is extracted from low-level noise in the same time-span.

Figure 16B:
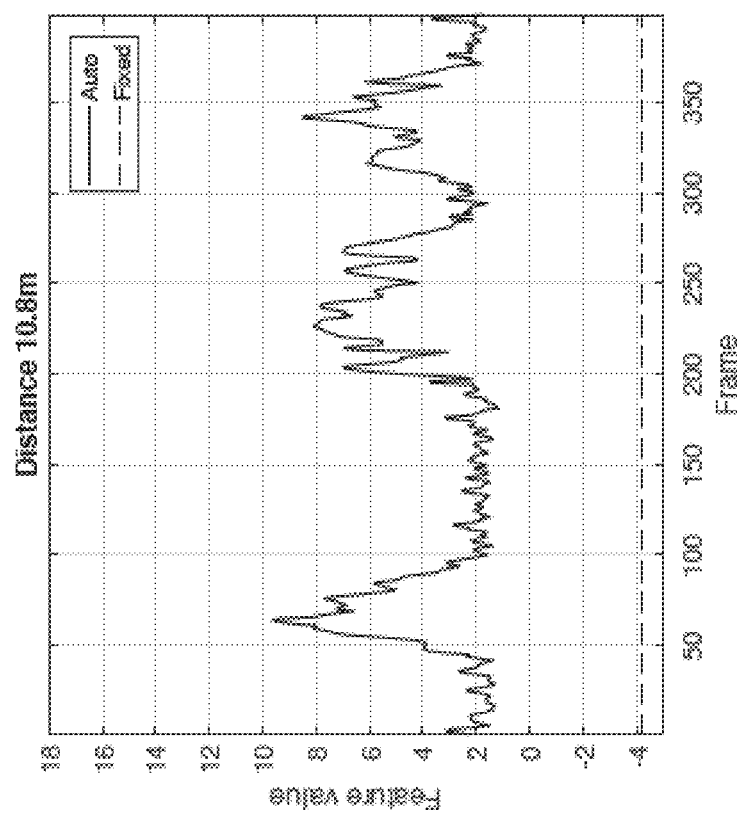
FIGS. 16A-16B is a graph in the frequency domain showing a comparison of feature values between that of the disclosed method and the reference fixed gain system at a middle spectrum part and for various distances.
Figure 16A:
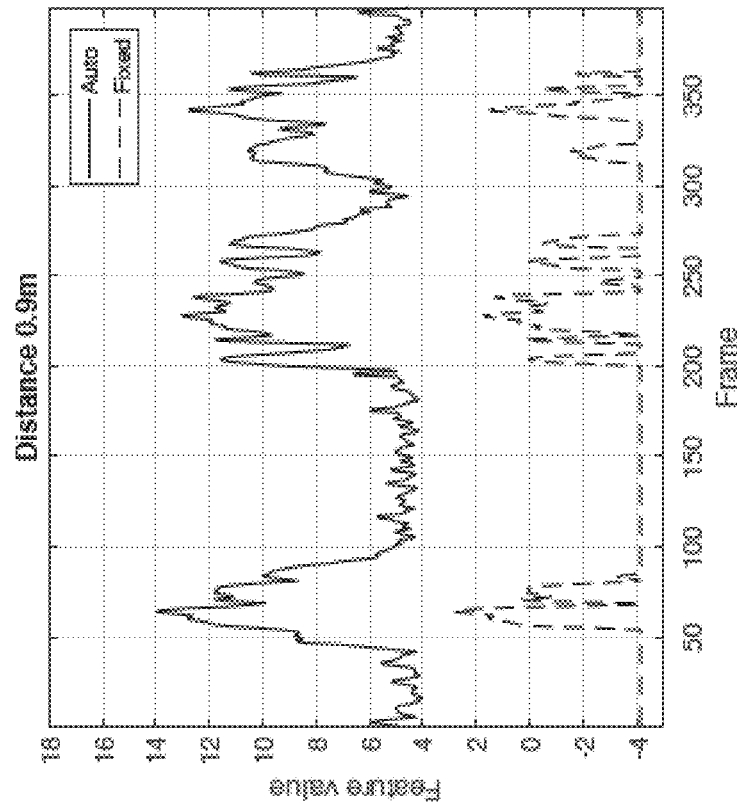
Figure 17:
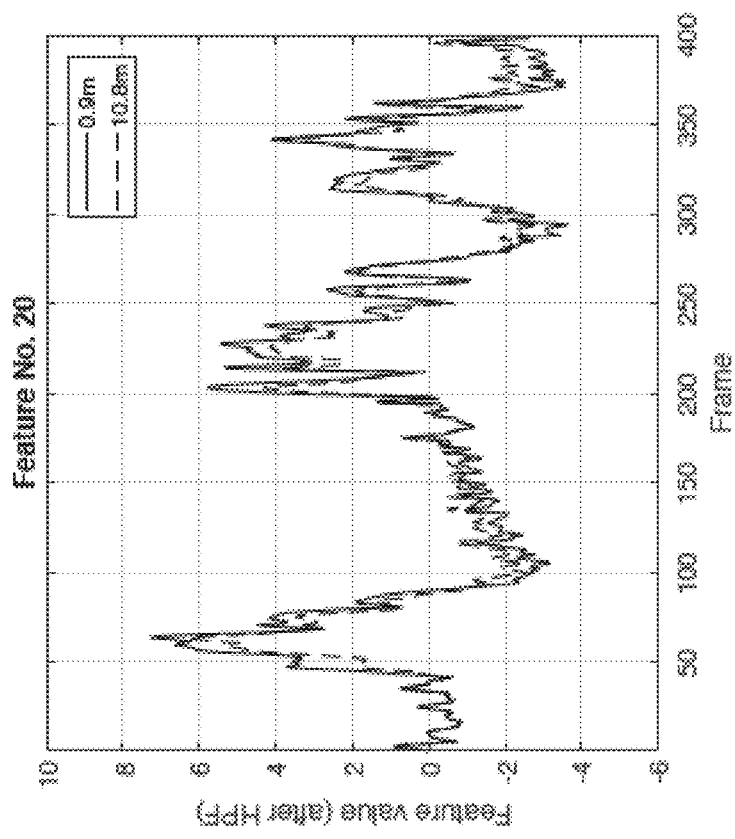
FIG. 17 is a graph showing feature values of the output samples and after high pass filtering of the disclosed method for various distances and at the low spectrum part.
Figure 18:
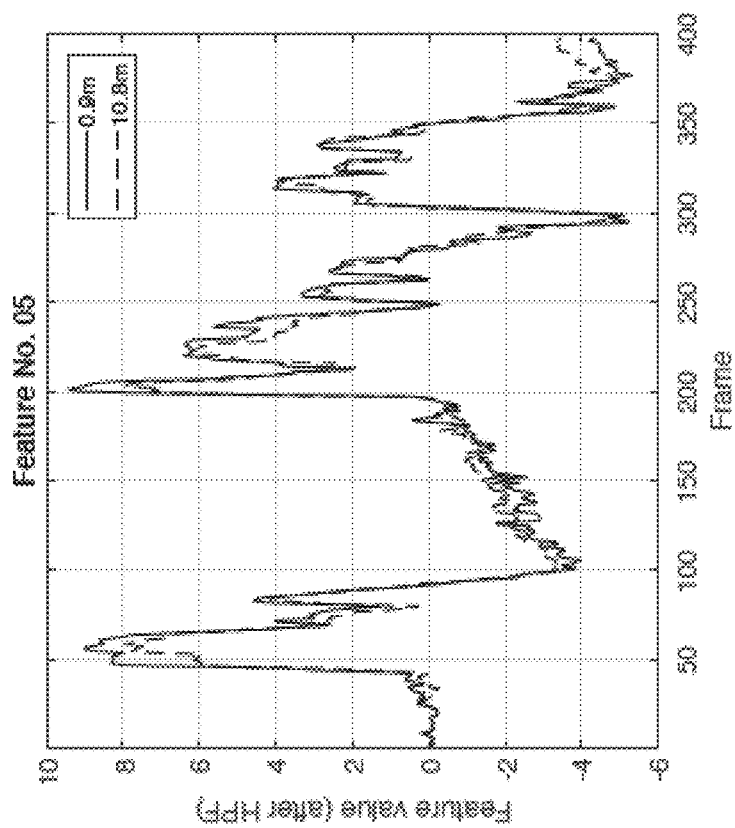
FIG. 18 is a graph showing feature values of the output samples and after high pass filtering of the disclosed method for various distances and at the middle spectrum part.
Figure 20:
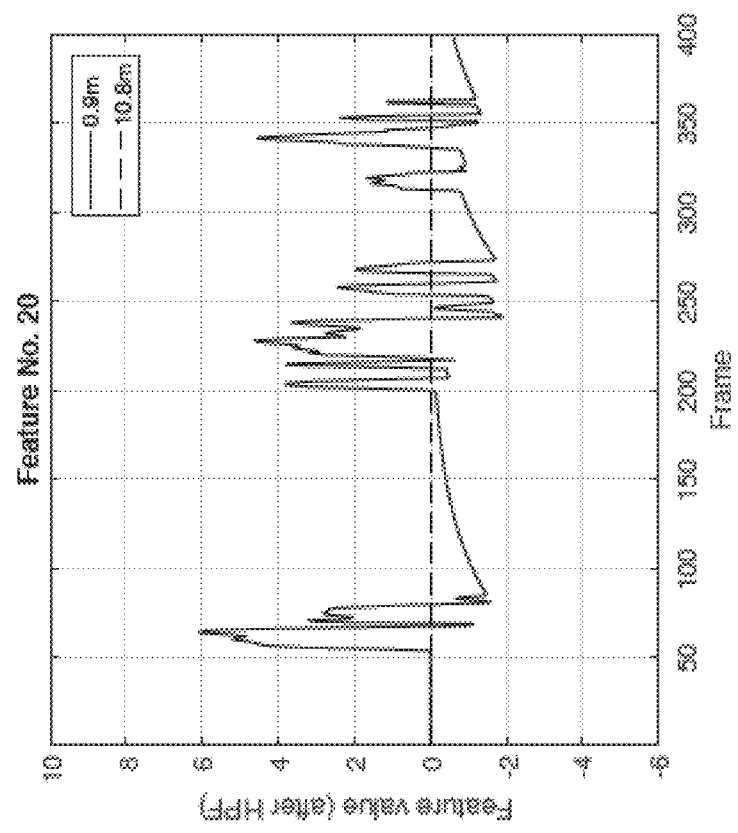
FIG. 20 is a graph showing feature values of the output samples and after high pass filtering of the reference fixed gain system for various distances and at the high spectrum part.
Figure 19:
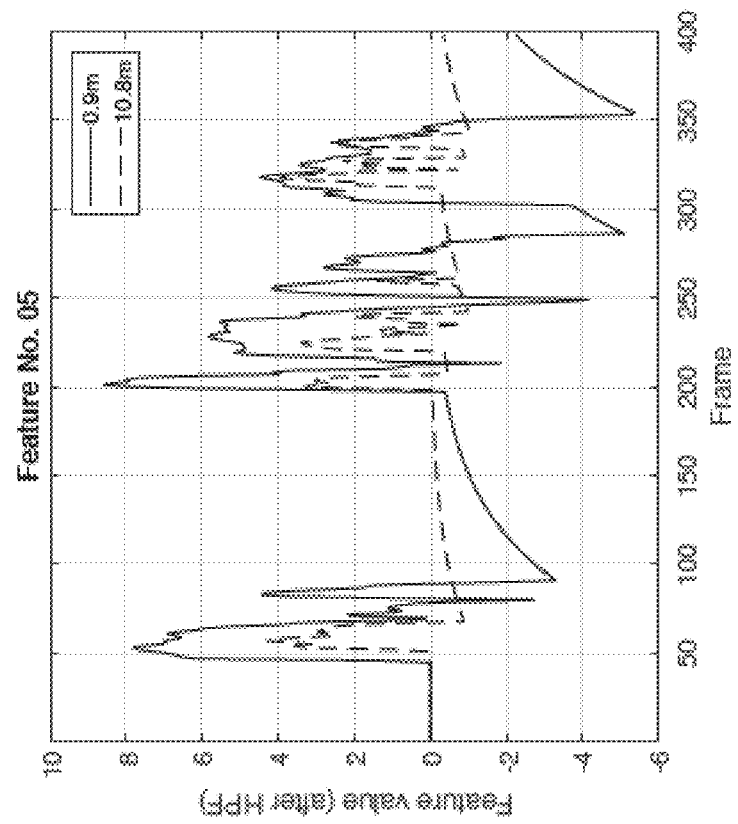
FIG. 19 is a graph showing feature values of the output samples and after high pass filtering of the reference fixed gain system for various distances and at the low spectrum part.

Referring to FIGS. 16A-16B, graphs 1600 and 1602 are in the frequency domain to show a comparison of feature values between that of the disclosed method (solid line) and the reference fixed gain system (dashed line) at a middle spectrum part (feature #20 (FIR 20)) and for various distances. The difference in feature values is even more apparent here for output #20 than #5. Here, the information carried by the signal from further distance for the reference fixed gain system is completely missing in the "fixed" case (the dashed line is flat).

The results of the experiment show that the bit-size conversion with automatic gain generation as disclosed herein makes the whole solution robust to low signal levels. Consequently, the accuracy of the solution significantly increases in far-field scenarios.

Also, it has been observed that the absolute level of an audio signal varies with the distance from microphone to audio source. To mitigate this effect, state-of-the-art ASR systems apply high-pass filters on extracted features prior to further processing. Thus, features generated by both the present bit-size conversion system and the conventional fixed system after high-pass filtering are compared to determine if distance affects the results.

Referring to FIGS. 17-20, graphs 1700, 1800, 1900, and 2000 each show features at two distances 0.9 m and 10.8 m after high pass filtering. Graphs 1700 and 1800 show the features of the present bit-size conversion system disclosed herein and at feature #5 and #20 respectively. Graphs 1900 and 2000 show the features of the conventional fixed system and at feature #5 and #20 respectively.

Graphs 1700 and 1800 show the two distances have very close results. Thus, the plots show that distance does not have a significant influence on calculated features with the disclosed bit-size conversion system. In contrast, the conventional "fixed" system on graphs 1900 and 2000 have distorted output and depends on the input signal level, and in turn, the distance.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement any systems, operations, modules or components as discussed herein. The machine or computer readable media may be a non-transitory article or medium, such as a non-transitory computer readable medium, and may be used with any of the examples mentioned above or other examples except that it does not include a transitory signal per se. It does include those elements other than a signal per se that may hold data temporarily in a "transitory" fashion such as RAM and so forth.

As used in any implementation described herein, the term "module" or "unit" refers to any combination of software logic, firmware logic and/or hardware logic configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth. For example, a module may be embodied in logic circuitry for the implementation via software, firmware, or hardware of the coding systems discussed herein.

As used in any implementation described herein, the term "logic unit" refers to any combination of firmware logic and/or hardware logic configured to provide the functionality described herein. The logic units may, collectively or individually, be embodied as circuitry that forms part of a larger system, for example, an integrated circuit (IC), system on-chip (SoC), and so forth. For example, a logic unit may be embodied in logic circuitry for the implementation firmware or hardware of the coding systems discussed herein. One of ordinary skill in the art will appreciate that operations performed by hardware and/or firmware may alternatively be implemented via software, which may be embodied as a software package, code and/or instruction set or instructions, and also appreciate that logic unit may also utilize a portion of software to implement its functionality.

As used in any implementation described herein, the term "component" may refer to a module or to a logic unit, as these terms are described above. Accordingly, the term "component" may refer to any combination of software logic, firmware logic, and/or hardware logic configured to provide the functionality described herein. For example, one of ordinary skill in the art will appreciate that operations performed by hardware and/or firmware may alternatively be implemented via a software module, which may be embodied as a software package, code and/or instruction set, and also appreciate that a logic unit may also utilize a portion of software to implement its functionality.

Figure 22:
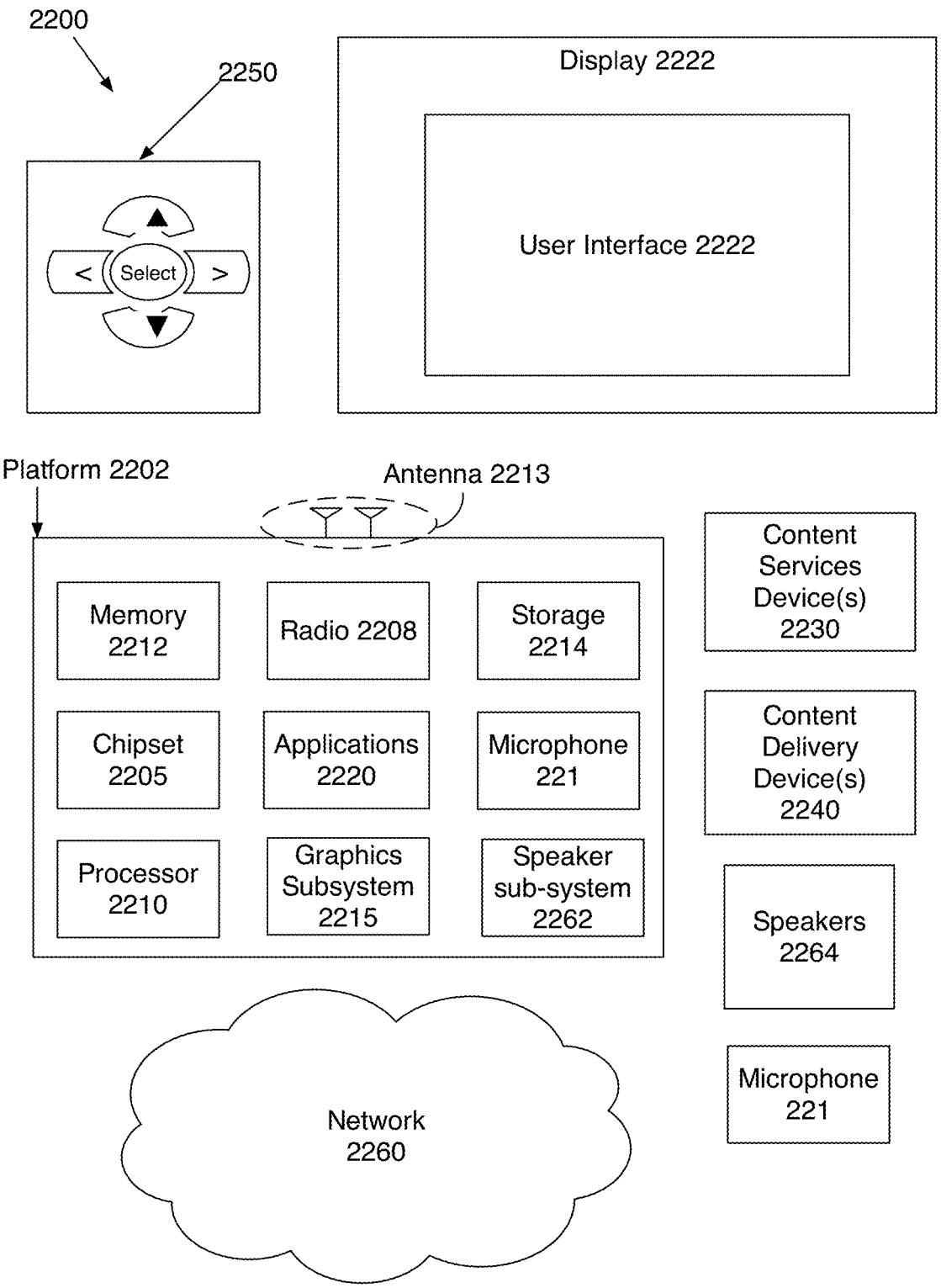
FIG. 22 is an illustrative diagram of another example system.

Referring to FIG. 22, an example system 2200, arranged in accordance with at least some implementations of the present disclosure. In various implementations, system 2200 may be a media system although system 2200 is not limited to this context. For example, system 2200 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet, smart speaker, or smart television), mobile internet device (MID), messaging device, data communication device, cameras (e.g. point-and-shoot cameras, super-zoom cameras, digital single-lens reflex (DSLR) cameras), and so forth.

In various implementations, system 2200 includes a platform 2202 coupled to a display 2220. Platform 2202 may receive content from a content device such as content services device(s) 2230 or content delivery device(s) 2240 or other similar content sources. As shown, in some examples, system 2200 may include microphone 221 implemented via platform 2202 or separately from the platform. Platform 2202 may receive input speech via microphone 221 as discussed herein. Likewise, a speaker sub-system 2262 may be provided to control speakers 2264 to emit audio input as sound. A navigation controller 2250 including one or more navigation features may be used to interact with, for example, platform 2202 and/or display 2220. Each of these components is described in greater detail below. In various implementations, system 2200 may perform bit-size conversion for audio processing as described.

In various implementations, platform 2202 may include any combination of a chipset 2205, processor 2210, memory 2212, antenna 2213, storage 2214, graphics subsystem 2215, applications 2216, microphone 221, and/or radio 2218. Chipset 2205 may provide intercommunication among processor 2210, memory 2212, storage 2214, graphics subsystem 2215, applications 2216 and/or radio 2218. For example, chipset 2205 may include a storage adapter (not depicted) capable of providing intercommunication with storage 2214.

Processor 2210 may be implemented as one or more neural network accelerators (NNAs), but otherwise where not limited to an NNA or when such structure can implement an NNA, a Complex Instruction Set Computer (CISC) or Reduced Instruction Set Computer (RISC) processors, x86 instruction set compatible processors, multi-core, or any other microprocessor or central processing unit (CPU). In various implementations, processor 2210 may be dual-core processor(s), dual-core mobile processor(s), and so forth.

Memory 2212 may be implemented as a volatile memory device such as, but not limited to, a Random Access Memory (RAM), Dynamic Random Access Memory (DRAM), or Static RAM (SRAM).

Storage 2214 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 2214 may include technology to increase the storage performance enhanced protection for valuable digital media when multiple hard drives are included, for example.

Graphics subsystem 2215 may perform processing of images such as still or video for display. Graphics subsystem 2215 may be a graphics processing unit (GPU) or a visual processing unit (VPU), for example. An analog or digital interface may be used to communicatively couple graphics subsystem 2215 and display 2220. For example, the interface may be any of a High-Definition Multimedia Interface, DisplayPort, wireless HDMI, and/or wireless HD compliant techniques. Graphics subsystem 2215 may be integrated into processor 2210 or chipset 2215. In some implementations, graphics subsystem 2215 may be a stand-alone device communicatively coupled to chipset 2205.

The graphics and/or video processing techniques described herein may be implemented in various hardware architectures. For example, graphics and/or video functionality may be integrated within a chipset. Alternatively, a discrete graphics and/or video processor may be used. As still another implementation, the graphics and/or video functions may be provided by a general purpose processor, including a multi-core processor. In further implementations, the functions may be implemented in a consumer electronics device.

Radio 2218 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 2218 may operate in accordance with one or more applicable standards in any version.

In various implementations, display 2220 may include any television type monitor or display. Display 2220 may include, for example, a computer display screen, touch screen display, video monitor, television-like device, and/or a television. Display 2220 may be digital and/or analog. In various implementations, display 2220 may be a holographic display. Also, display 2220 may be a transparent surface that may receive a visual projection. Such projections may convey various forms of information, images, and/or objects. For example, such projections may be a visual overlay for a mobile augmented reality (MAR) application. Under the control of one or more software applications 2216, platform 2202 may display user interface 2222 on display 2220.

In various implementations, content services device(s) 2230 may be hosted by any national, international and/or independent service and thus accessible to platform 2202 via the Internet, for example. Content services device(s) 2230 may be coupled to platform 2202 and/or to display 2220. Platform 2202 and/or content services device(s) 2230 may be coupled to a network 2260 to communicate (e.g., send and/or receive) media information to and from network 2260. Content delivery device(s) 2240 also may be coupled to platform 2202 and/or to display 2220.

In various implementations, content services device(s) 2230 may include a cable television box, personal computer, network, telephone, Internet enabled devices or appliance capable of delivering digital information and/or content, and any other similar device capable of uni-directionally or bi-directionally communicating content between content providers and platform 2202 and/display 2220, via network 2260 or directly. It will be appreciated that the content may be communicated uni-directionally and/or bi-directionally to and from any one of the components in system 2200 and a content provider via network 2260. Examples of content may include any media information including, for example, video, music, medical and gaming information, and so forth.

Content services device(s) 2230 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 2202 may receive control signals from navigation controller 2250 having one or more navigation features. The navigation features of controller 2250 may be used to interact with user interface 2222, for example. In various implementations, navigation controller 2250 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 2250 may be replicated on a display (e.g., display 2220) by movements of a pointer, cursor, focus ring, or other visual indicators displayed on the display. For example, under the control of software applications 2216, the navigation features located on navigation controller 2250 may be mapped to virtual navigation features displayed on user interface 2222, for example. In various implementations, controller 2250 may not be a separate component but may be integrated into platform 2202 and/or display 2220. The present disclosure, however, is not limited to the elements or in the context shown or described herein.

In various implementations, drivers (not shown) may include technology to enable users to instantly turn on and off platform 2202 like a television with the touch of a button after initial boot-up, when enabled, for example. Program logic may allow platform 2202 to stream content to media adaptors or other content services device(s) 2230 or content delivery device(s) 2240 even when the platform is turned "off." In addition, chipset 2205 may include hardware and/or software support for 5.1 surround sound audio and/or high definition 7.1 surround sound audio, for example. Drivers may include a graphics driver for integrated graphics platforms. In various implementations, the graphics driver may comprise a peripheral component interconnect (PCI) Express graphics card.

In various implementations, any one or more of the components shown in system 2200 may be integrated. For example, platform 2202 and content services device(s) 2230 may be integrated, or platform 2202 and content delivery device(s) 2240 may be integrated, or platform 2202, content services device(s) 2230, and content delivery device(s) 2240 may be integrated, for example. In various implementations, platform 2202 and display 2220 may be an integrated unit. Display 2220 and content service device(s) 2230 may be integrated, or display 2220 and content delivery device(s) 2240 may be integrated, for example. These examples are not meant to limit the present disclosure.

In various implementations, system 2200 may be implemented as a wireless system, a wired system, or a combination of both. When implemented as a wireless system, system 2200 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 2200 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 2202 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The implementations, however, are not limited to the elements or in the context shown or described in FIG. 22.

Figure 23:
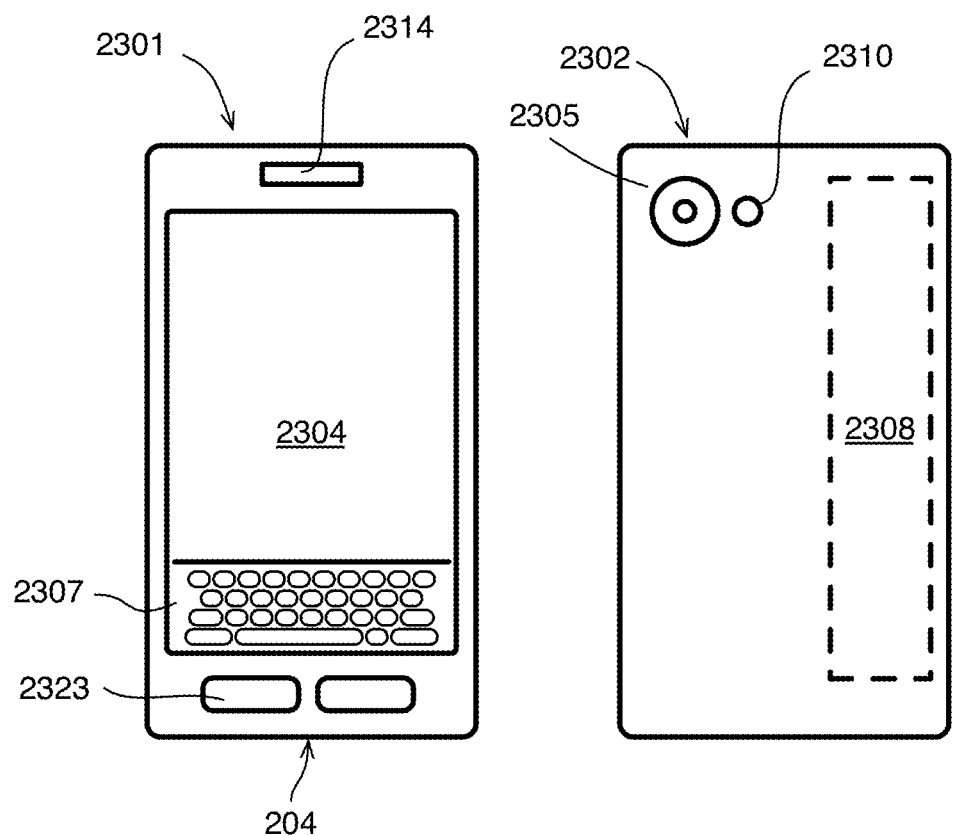
FIG. 23 illustrates an example device, all arranged in accordance with at least some implementations of the present disclosure.

Referring to FIG. 23, and as described above, systems 2100 and 2200 may be embodied in varying physical styles or form factors including a small form factor device 2300, arranged in accordance with at least some implementations of the present disclosure. Thus, in some examples, systems 2100 or 2200 may be implemented via device 2300. In other examples, other devices or systems, or portions thereof may be implemented via device 2300. In various implementations, for example, device 2300 may be implemented as a mobile computing device a having wireless capabilities. A mobile computing device may refer to any device having a processing system and a mobile power source or supply, such as one or more batteries, for example.

Examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, smart device (e.g., smart phone, smart tablet or smart mobile television), mobile internet device (MID), messaging device, data communication device, cameras, and so forth.

Examples of a mobile computing device also may include computers that are arranged to be worn by a person, such as a wrist computers, finger computers, ring computers, eyeglass computers, belt-clip computers, arm-band computers, shoe computers, clothing computers, and other wearable computers. In various implementations, for example, a mobile computing device may be implemented as a smart phone capable of executing computer applications, as well as voice communications and/or data communications. Although some implementations may be described with a mobile computing device implemented as a smart phone by way of example, it may be appreciated that other implementations may be implemented using other wireless mobile computing devices as well. The implementations are not limited in this context.

As shown in FIG. 23, device 2300 may include a housing with a front 2301 and a back 2302. Device 2300 includes a display 2304, an input/output (I/O) device 2306, and an integrated antenna 2308. Device 2300 also may include navigation features 2312. I/O device 2306 may include any suitable I/O device for entering information into a mobile computing device. Examples for I/O device 2306 may include an alphanumeric keyboard, a numeric keypad, a touch pad, input keys, buttons, switches, microphones, speakers, voice recognition device and software, and so forth. Information also may be entered into device 2300 by way of microphone 204, or may be digitized by a voice recognition device. As shown, device 2300 may include a camera 2305 (e.g., including a lens, an aperture, and an imaging sensor) and a flash 2310 integrated into back 2302 (or elsewhere) of device 2300.

Various implementations may be implemented using hardware elements, and including those specified above that are implemented as neural network accelerators (NNAs). Otherwise, when not specified, the implementations may be implemented as hardware elements, software elements, or a combination of both. Examples of other hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an implementation is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one implementation may be implemented by representative instructions stored on a machine-readable medium which represents various logic within the processor, which when read by a machine causes the machine to fabricate logic to perform the techniques described herein. Such representations, known as "IP cores," may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further implementations.

By an example one or more first implementations, an audio processing device comprises memory storing audio input including human speech and in the form of initial samples with a first bit-size; and at least one processor communicatively coupled to the memory to operate by: dividing at least one of the initial samples into multiple sample parts; generating at least one gain formed by at least one neural network accelerator; applying the at least one gain to at least one of the sample parts to form at least one scaled sample part; and generating a scaled output sample in a second bit size comprising combining at least portions of the multiple sample parts including the at least one scaled sample part.

By one or more second implementations, and further to the first implementation, wherein the sample parts each have a size so that the sample parts cooperatively hold all of the bits from the initial sample.

By one or more third implementations, and further to the first or second implementation, wherein the sample parts are of the second bit-size.

By one or more fourth implementations, and further to any of the first to third implementation, wherein the sample parts comprise at least a high sample part having most significant bits from the initial sample and a low sample part having least significant bits from the initial sample.

By one or more fifth implementations, and further to any of the first to third implementation, wherein the sample parts comprise at least a high sample part having most significant bits from the initial sample and a low sample part having least significant bits from the initial sample, and wherein the dividing comprises storing the initial sample in a container of a transition sample with a third bit-size that is larger than the first bit-size of the initial sample and evenly divisible into the sample parts.

By one or more sixth implementations, and further to any of the first to third implementation, wherein the sample parts comprise at least a high sample part having most significant bits from the initial sample and a low sample part having least significant bits from the initial sample, and wherein the dividing comprises storing the initial sample in a container of a transition sample with a third bit-size that is larger than the first bit-size of the initial sample and evenly divisible into the sample parts, and wherein the first bit-size is 24 bits, the second bit-size is 16 bits, and the third bit-size is 32 bits.

By one or more seventh implementations, and further to any of the first to third implementation, wherein the sample parts comprise at least a high sample part having most significant bits from the initial sample and a low sample part having least significant bits from the initial sample, and wherein the dividing comprises storing the initial sample in a container of a transition sample with a third bit-size that is larger than the first bit-size of the initial sample and evenly divisible into the sample parts, and wherein the at least one processor is arranged to operate by deinterleaving a sequence of the transition samples, wherein each transition sample has a high sample part and a low sample part, and the deinterleaving to generate a high sample vector of high sample parts separate from a low sample vector of low sample parts to separately input the high and low sample vectors into a neural network accelerator.

By one or more eighth implementations, and further to any of the first to seventh implementation, wherein the at least one processor to shift low sample parts having the least significant bits (LSBs) of the initial samples to reserve a bit space in the low sample part for a sign bit using at least one neural network accelerator.

By one or more ninth implementations, and further to any of the first to eighth implementation, wherein the at least one processor operates by determining absolute value versions of the sample parts and a separate sign vector maintaining the sign of at least one of the sample parts to use to generate the scaled output sample.

By an example one or more tenth implementations, a method of audio processing comprises obtaining audio input including human speech and in the form of initial samples with a first bit-size; dividing at least one of the initial samples into multiple sample parts; generating, by at least one neural network accelerator, at least one gain; applying the at least one gain to at least one of the sample parts to form at least one scaled sample part; and generating a scaled output sample in a second bit size comprising combining at least portions of the multiple sample parts and including the at least one scaled sample part.

By one or more eleventh implementations, and further to the tenth implementation, wherein the at least one gain is computed dynamically depending on the sample parts.

By one or more twelfth implementations, and further to the tenth or eleventh implementation, wherein the at least one gain is computed by using a count of the number of bit spaces occupied by one of the sample parts.

By an example thirteenth implementation, and further to any of the tenth to twelfth implementations, wherein the same at least one gain is used for multiple sample parts of a same sample set of multiple parts of multiple initial samples regardless of which sample part was used to form the gain.

By one or more fourteenth implementations, and further to any of the tenth to thirteenth implementations, wherein multiple initial samples of a sample set of initial samples are divided into sample parts, and wherein the at least one gain is generated by using only the data of a high sample part with the highest value among all high sample parts of the set.

By one or more fifteenth implementations, and further to any of the tenth to thirteenth implementations, wherein multiple initial samples of a sample set of initial samples are divided into sample parts, and wherein the at least one gain is generated by using only the data of a high sample part with the highest value among all high sample parts of the set, and wherein the at least one processor is arranged to determine the high sample part with the highest value by using max pooling layers of a neural network.

By an example one or more sixteenth implementations, a computer-implemented system for audio processing comprises at least one microphone to capture audio input including human speech; memory to store the audio input in the form of initial samples of a first bit-size; at least one processor communicatively coupled to the at least one microphone and at least one memory, and to operate by: dividing at least one of the initial samples into multiple sample parts; generating at least one gain formed by at least one neural network accelerator; applying the at least one gain to at least one of the sample parts to form at least one scaled sample part; and generating a scaled output sample in a second bit size comprising combining at least portions of the multiple sample parts and including the at least one scaled sample part.

By one or more seventeenth implementations, and further to the sixteenth implementation, wherein the at least one gain is arranged so that applying the at least one gain causes a bit shift in the sample part to place a most significant bit of the sample part at the highest available bit space of a scaled sample part to be used to form the scaled output sample.

By one or more eighteenth implementations, and further to the sixteenth implementation, wherein the at least one gain is arranged so that applying the at least one gain causes a bit shift in the sample part to place a most significant bit of the sample part at the highest available bit space of a scaled sample part to be used to form the scaled output sample, and wherein the bit-shift provides empty bit spaces on the scaled sample part to receive bits of a scaled low sample part associated with the least significant bits of the initial sample.

By one or more nineteenth implementations, and further to any of the sixteenth to eighteenth implementations, wherein the scaled output sample is formed by combining at least portions of a scaled high sample part and a scaled low sample part.

By an example one or more twentieth implementations, at least one non-transitory machine-readable medium comprising instructions that, in response to being executed on a computing device, cause the computing device to operate by: obtaining audio input including human speech and in the form of initial samples with a first bit-size; dividing at least one of the initial samples into multiple sample parts; generating, by at least one neural network accelerator, at least one gain; applying the at least one gain to at least one of the sample parts to form at least one scaled sample part; and generating a scaled output sample in a second bit size comprising combining at least portions of the multiple sample parts and including the at least one scaled sample part.

By one or more twenty-first implementations, and further to the twentieth implementation, wherein at least one of the dividing, applying the at least one gain, and generating a scaled output sample are performed by one or more neural network accelerators without the use of a digital signal processor (DSP).

By one or more twenty-second implementations, and further to the twentieth or twenty-first implementation, wherein the instructions cause the computing device to operate by omitting the generating and applying when at least one of the sample parts is zero or has a bit in a bit position in the sample part that cannot be shifted higher by applying the gain.

By one or more twenty-third implementations, and further to any of the twentieth to twenty-second implementations, wherein the instructions cause the computing device to operate by: performing an audio processing operation with the scaled output samples; applying a gain adjustment to output of the audio processing operation that at least partly de-scales the output of the audio processing operation; and using the de-scaled output samples for further audio processing.

By one or more twenty-fourth implementations, and further to any of the twentieth to twenty-second implementations, wherein the instructions cause the computing device to operate by: performing an audio processing operation with the scaled output samples; applying a gain adjustment to output of the audio processing operation that at least partly de-scales the output of the audio processing operation; and using the de-scaled output samples for further audio processing, and wherein the audio processing operation is feature extraction of automatic speech recognition.

By one or more twenty-fifth implementations, and further to any of the twentieth to twenty-second implementations, wherein the instructions cause the computing device to operate by: performing an audio processing operation with the scaled output samples; applying a gain adjustment to output of the audio processing operation that at least partly de-scales the output of the audio processing operation; and using the de-scaled output samples for further audio processing, and wherein the gain adjustment is computed by determining an offset in sample value caused by at least one of the gains.

In one or more twenty-sixth implementations, a device or system includes a memory and a processor to perform a method according to any one of the above implementations.

In one or more twenty-seventh implementations, at least one machine readable medium includes a plurality of instructions that in response to being executed on a computing device, cause the computing device to perform a method according to any one of the above implementations.

In one or more twenty-eighth implementations, an apparatus may include means for performing a method according to any one of the above implementations.

The above examples may include specific combination of features. However, the above examples are not limited in this regard and, in various implementations, the above examples may include undertaking only a subset of such features, undertaking a different order of such features, undertaking a different combination of such features, and/or undertaking additional features than those features explicitly listed. For example, all features described with respect to any example methods herein may be implemented with respect to any example apparatus, example systems, and/or example articles, and vice versa.

What is claimed is:

1. An audio processing device comprising:
memory storing audio input including human speech and in a form of initial samples with a first bit-size; and
at least one processor communicatively coupled to the memory to operate by:
dividing at least one of the initial samples into multiple sample parts;
generating at least one gain formed by at least one neural network accelerator;
applying the at least one gain to at least one of the sample parts to form at least one scaled sample part; and
generating a scaled output sample in a second bit-size comprising combining at least portions of the multiple sample parts including the at least one scaled sample part, and wherein a portion of one of the sample parts being combined has most significant bits (MSBs) of the initial sample and a portion of another one of the sample parts being combined has least significant bits (LSBs) of the initial sample.

2. The device of claim 1, wherein the sample parts each have a size so that the sample parts cooperatively hold all of the bits from the initial sample.

3. The device of claim 1, wherein the sample parts are of the second bit-size.

4. The device of claim 1, wherein the sample parts comprise at least a high sample part filled with the most significant bits and other bits from the initial sample and a low sample part having the least significant bits from the initial sample and remaining bit spaces filled with zeros.

5. The device of claim 1, wherein the dividing comprises storing the initial sample in a container of a transition sample with a third bit-size that is larger than the first bit-size of the initial sample and evenly divisible into the sample parts.

6. The device of claim 5, wherein the first bit-size is 24 bits, the second bit-size is 16 bits, and the third bit-size is 32 bits.

7. The device of claim 5, wherein the at least one processor is arranged to operate by deinterleaving a sequence of the transition samples, wherein each transition sample has a high sample part and a low sample part, and the deinterleaving to generate a high sample vector of high sample parts separate from a low sample vector of low sample parts to separately input the high and low sample vectors into a neural network accelerator.

8. The device of claim 7, wherein the at least one processor to shift the low sample parts having the least significant bits (LSBs) of the initial samples to reserve a bit space in the low sample part for a sign bit using at least one neural network accelerator.

9. The device of claim h wherein the at least one processor operates by determining absolute value versions of the sample parts and a separate sign vector maintaining a sign of at least one of the sample parts to use to generate the scaled output sample.

10. A method of audio processing comprising:
obtaining audio input including human speech and in a form of initial samples with a first bit-size;
dividing at least one of the initial samples into multiple sample parts;
generating, by at least one neural network accelerator, at least one gain;
applying the at least one gain to at least one of the sample parts to form at least one scaled sample part; and
generating a scaled output sample in a second bit-size comprising combining at least portions of the multiple sample parts and including the at least one scaled sample part, and wherein a portion of one of the sample parts being combined has most significant bits (MSBs) of the initial sample and a portion of another one of the sample parts being combined has least significant bits (LSBs) of the initial sample.

11. The method of claim 10, wherein the at least one gain is computed dynamically depending on the sample parts.

12. The method of claim 10, wherein the at least one gain is computed by using a count of a number of bit spaces occupied by one of the sample parts.

13. The method of claim 10, wherein the same at least one gain is used for multiple sample parts of a same sample set of multiple parts of multiple initial samples regardless of which sample part was used to form the gain.

14. The method of claim 10, wherein multiple initial samples of a sample set of initial samples are divided into sample parts, and wherein the at least one gain is generated by using only data of a high sample part with the highest value among all high sample parts of the set.

15. The method of claim 14, comprising determining the high sample part with the highest value by using max pooling layers of a neural network.

16. A computer-implemented system for audio processing comprising:
at least one microphone to capture audio input including human speech;
memory to store the audio input in of initial samples of a first bit-size;
at least one processor communicatively coupled to the at least one microphone and at least one memory, and to operate by:
dividing at least one of the initial samples into multiple sample parts;
generating at least one gain formed by at least one neural network accelerator;
applying the at least one gain to at least one of the sample parts to form at least one scaled sample part; and
generating a scaled output sample in a second bit-size comprising combining at least portions of the multiple sample parts and including the at least one scaled sample part, and wherein a portion of one of the sample parts being combined has most significant bits (MSBs) of the initial sample and a portion of another one of the sample parts being combined has least significant bits (LSBs) of the initial sample.

17. The system of claim 16, wherein the at least one gain is arranged so that applying the at least one gain causes a bit-shift in the sample part to place a most significant bit of the sample part at the highest available bit space of a scaled sample part to be used to form the scaled output sample.

18. The system of claim 17, wherein the bit-shift provides empty bit spaces on the scaled sample part to receive bits of a scaled low sample part associated with the least significant bits of the initial sample.

19. The system of claim 16, wherein the scaled output sample is formed by combining at least portions of a scaled high sample part and a scaled low sample part.

20. At least one non-transitory machine readable medium comprising instructions that, in response to being executed on a computing device, cause the computing device to operate by:
obtaining audio input including human speech and in a form of initial samples with a first bit-size;
dividing at least one of the initial samples into multiple sample parts;
generating, by at least one neural network accelerator, at least one gain;
applying the at least one gain to at least one of the sample parts to form at least one scaled sample part; and
generating a scaled output sample in a second bit-size comprising combining at least portions of the multiple sample parts and including the at least one scaled sample part, and wherein a portion of one of the sample parts being combined has most significant bits (MSBs) of the initial sample and a portion of another one of the sample parts being combined has least significant bits (LSBs) of the initial sample.

21. The machine readable medium of claim 20, wherein at least one of the dividing, applying the at least one gain, and generating a scaled output sample are performed by one or more neural network accelerators without the use of a digital signal processor (DSP).

22. The machine readable medium of claim 20, wherein the instructions cause the computing device to operate by omitting the generating and applying when at least one of the sample parts is zero or has a bit in a bit position in the sample part that cannot be shifted higher by applying the gain.

23. The machine readable medium of claim 20 wherein the instructions cause the computing device to operate by:
performing an audio processing operation with the scaled output samples;
applying a gain adjustment to output of the audio processing operation that at least partly de-scales the output of the audio processing operation; and
using the de-scaled output samples for further audio processing.

24. The machine readable medium of claim 23 wherein the audio processing operation is feature extraction of automatic speech recognition.

25. The machine readable medium of claim 23 wherein the gain adjustment is computed by determining an offset in sample value caused by at least one of the gains.

* * * * *